(12) United States Patent
Hsieh et al.

(10) Patent No.: US 6,809,358 B2
(45) Date of Patent: Oct. 26, 2004

(54) PHOTOCONDUCTOR ON ACTIVE PIXEL IMAGE SENSOR

(75) Inventors: Tzu-Chiang Hsieh, Fremont, CA (US); Calvin Chao, Cupertino, CA (US)

(73) Assignee: e-Phocus, Inc., San Jose, CA (US)

( * ) Notice: Subject to any disclaimer, the term of this patent is extended or adjusted under 35 U.S.C. 154(b) by 0 days.

(21) Appl. No.: 10/648,129

(22) Filed: Aug. 26, 2003

(65) Prior Publication Data

US 2004/0036010 A1 Feb. 26, 2004

Related U.S. Application Data

(63) Continuation-in-part of application No. 10/371,618, filed on Feb. 22, 2003, now Pat. No. 6,730,900, and a continuation-in-part of application No. 10/229,953, filed on Aug. 27, 2002, and a continuation-in-part of application No. 10/229,954, filed on Aug. 27, 2002, and a continuation-in-part of application No. 10/229,955, filed on Aug. 27, 2002, and a continuation-in-part of application No. 10/229,956, filed on Aug. 27, 2002, and a continuation-in-part of application No. 10/072,637, filed on Feb. 5, 2002, now Pat. No. 6,730,914.

(51) Int. Cl.[7] ..................... H01L 31/062; H01L 31/113

(52) U.S. Cl. .................. 257/291; 257/290; 257/292; 257/293

(58) Field of Search ................. 257/290, 291, 257/292, 293; 438/57, 59, 65, 6

Primary Examiner—Long Pham
(74) Attorney, Agent, or Firm—John R. Ross

(57) ABSTRACT

A MOS or CMOS based photoconductor on active pixel image sensor. Thin layers of semi-conductor material, doped to PIN or NIP photoconducting layers, located above MOS and/or CMOS pixel circuits produce an array of layered photodiodes. Positive and negative charges produced in the layered photodiodes are collected and stored as electrical charges in the MOS and/or CMOS pixel circuits. The present invention also provides additional MOS or CMOS circuits for reading out the charges and for converting the charges into images. With the layered photodiode of each pixel fabricated as continuous layers of charge generating material on top of the MOS and/or CMOS pixel circuits, extremely small pixels are possible with almost 100 percent packing factors. MOS and CMOS fabrication techniques permit sensor fabrication at very low costs. In preferred embodiments all of the sensor circuits are incorporated on or in a single crystalline substrate along with the sensor pixel circuits. Techniques are disclosed for tailoring the spectral response of the sensor for particular applications.

34 Claims, 33 Drawing Sheets

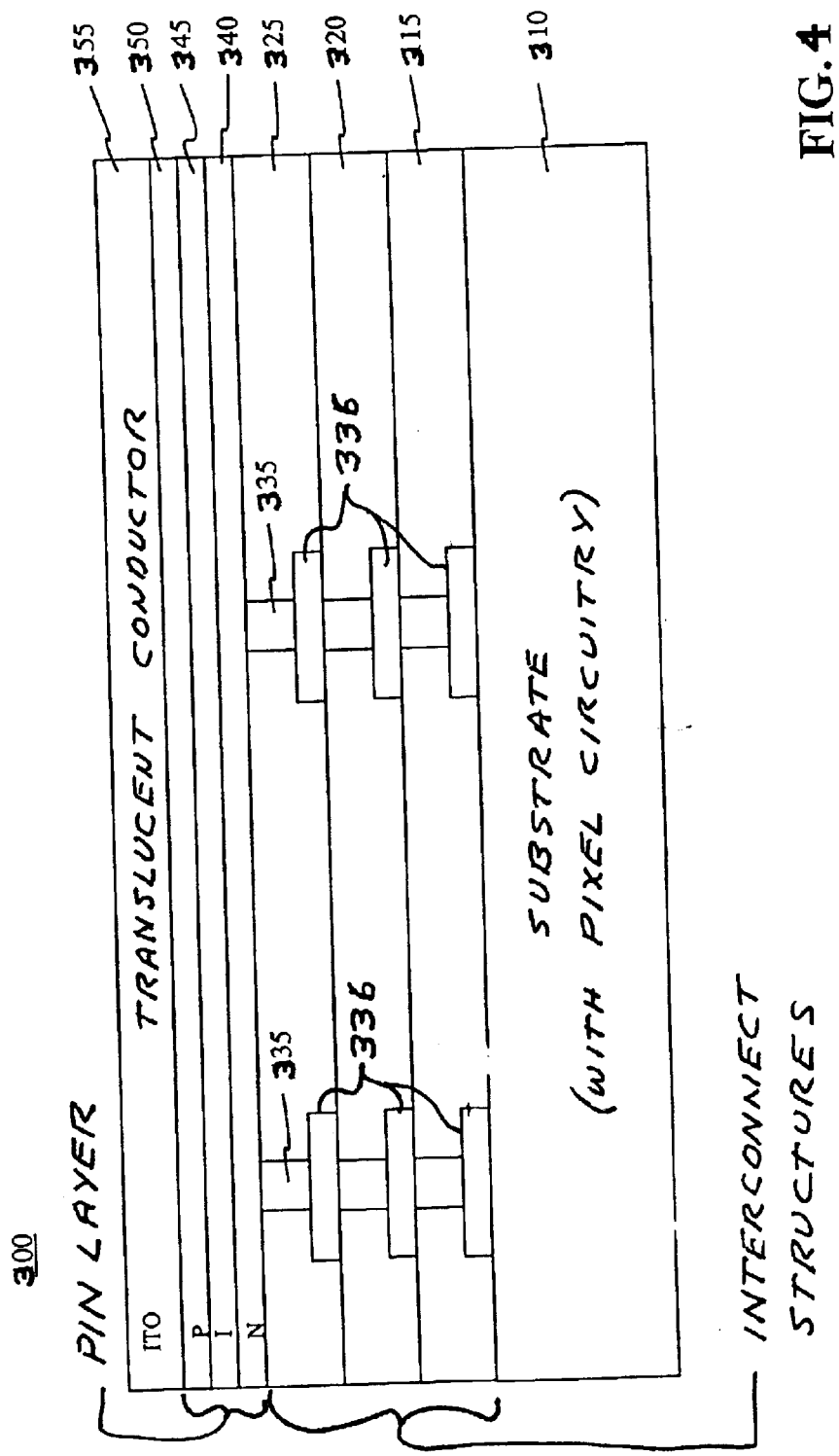

Individual Pixel Cell Circuitry

PBIN Pixel Architecture

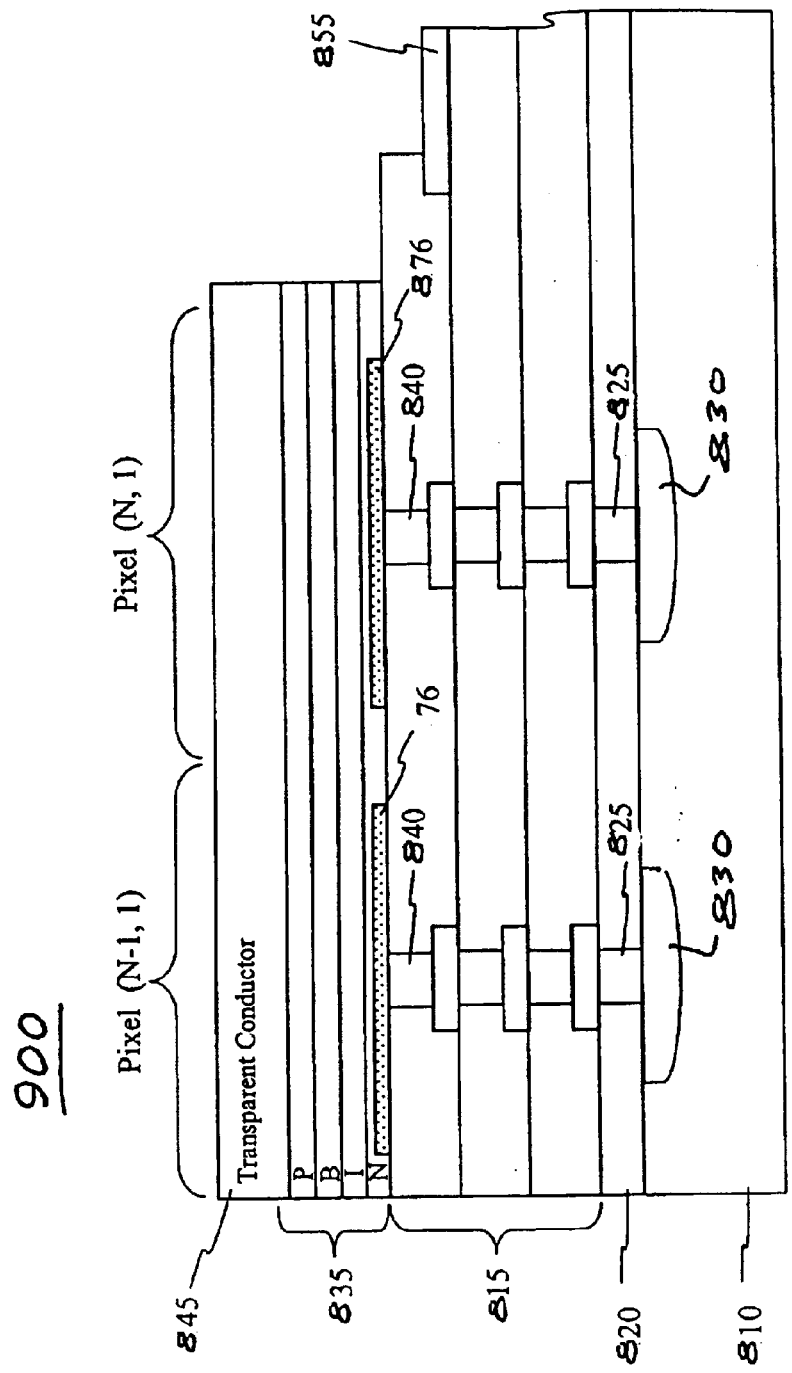

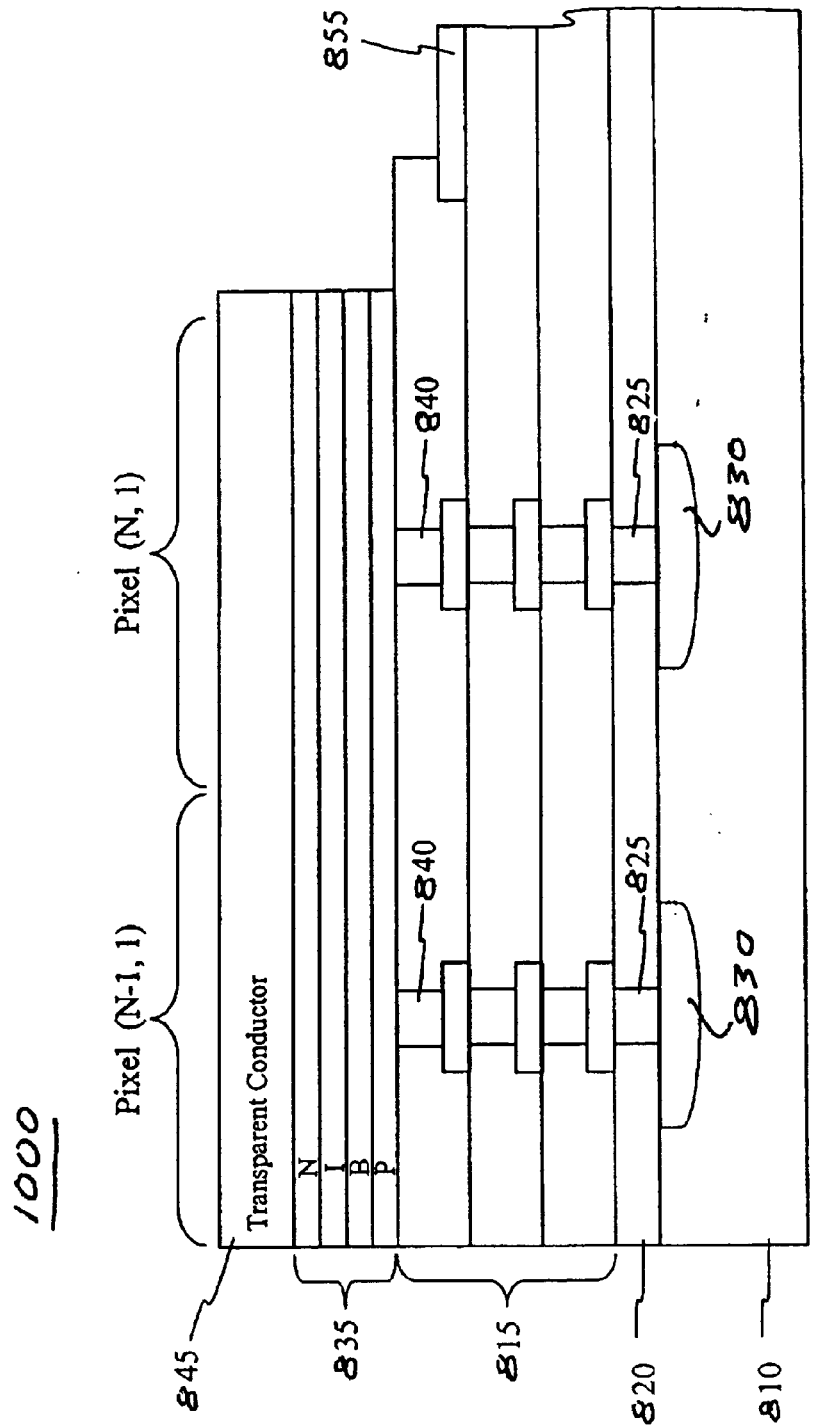

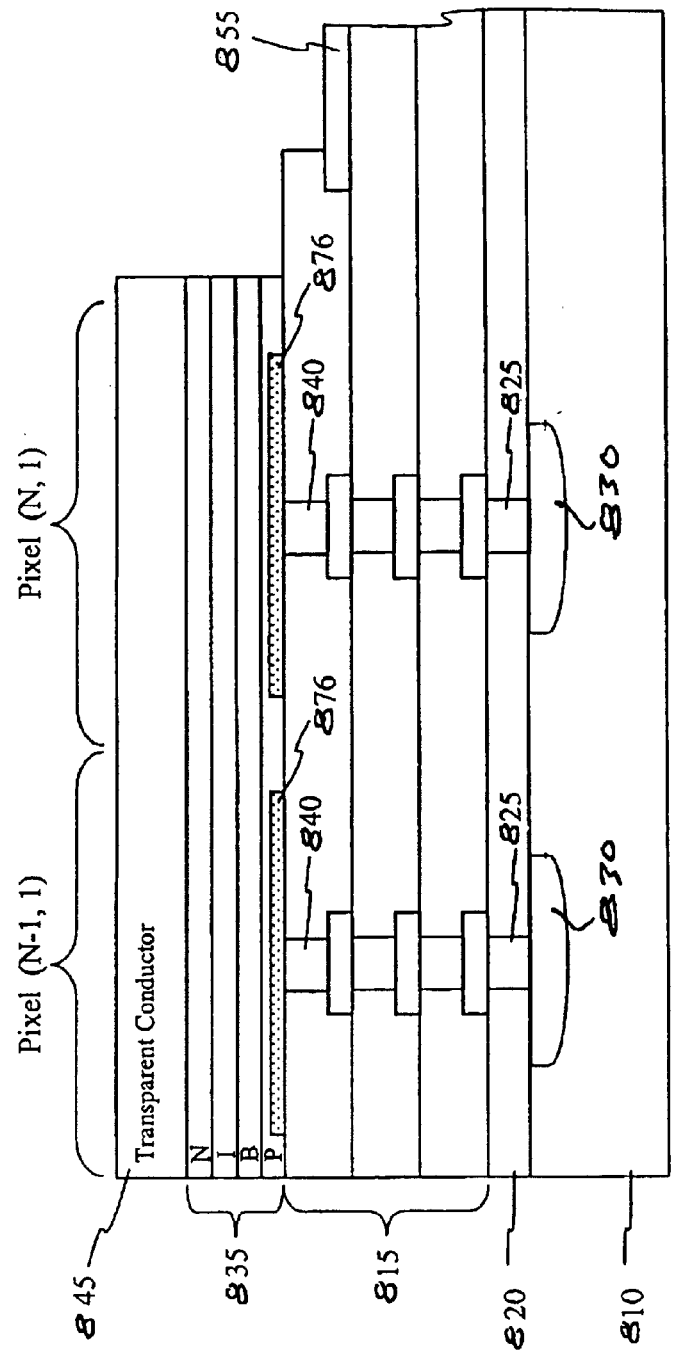

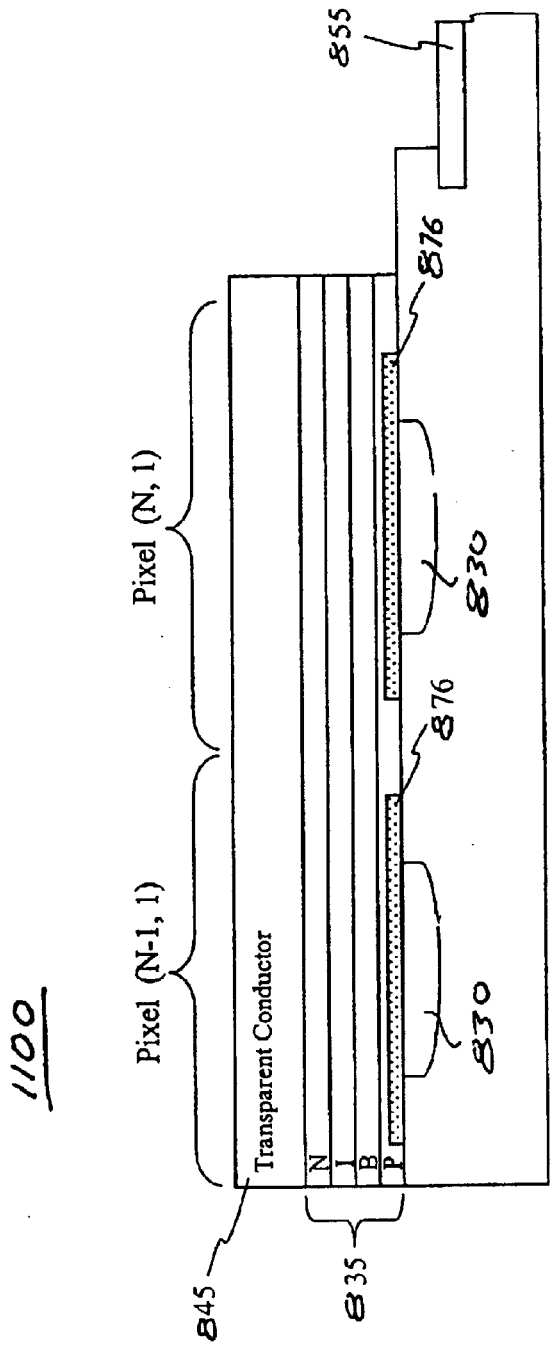

POAP Sensor Having A Discontinuous Trench

POAP Sensors Having Trench And Patterned Bottom Layers

Individual Pixel Cell Circuitry Without GBT
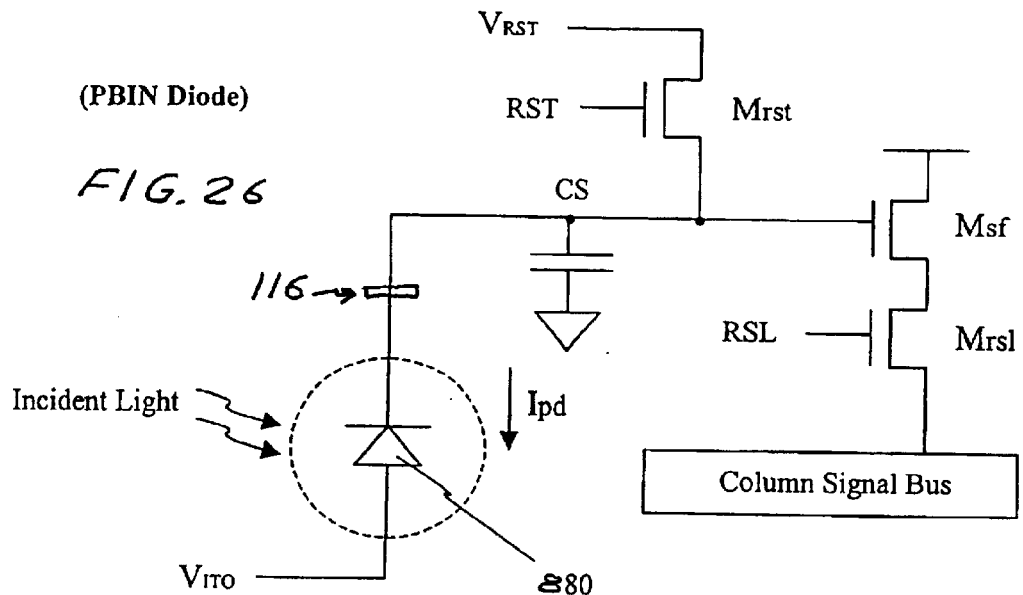
FIG. 26 (PBIN Diode)
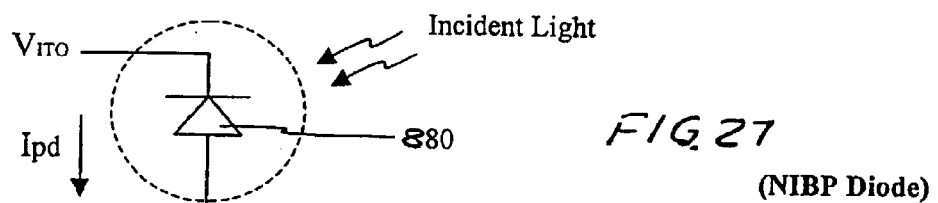
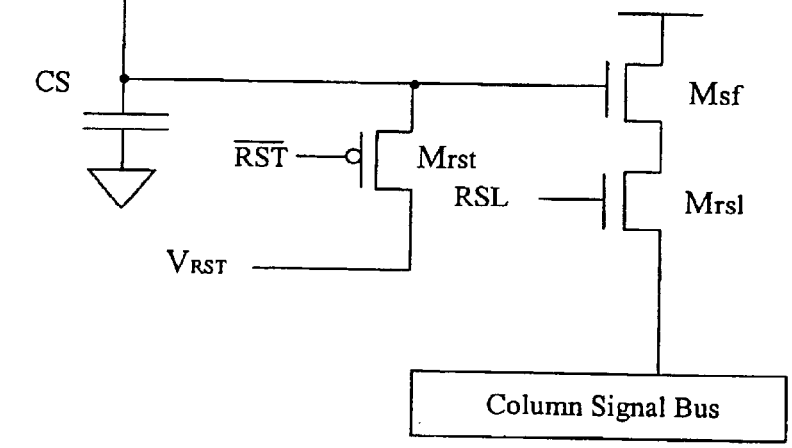
FIG. 27 (NIBP Diode)

POAP Sensor Fabrication

PHOTOCONDUCTOR ON ACTIVE PIXEL IMAGE SENSOR

FIELD OF THE INVENTION

This application is a continuation in part of U.S. Pat. application Ser. No. 10/072,637 filed Feb. 5, 2002, now U.S. Pat. No. 6,730,914 Ser. No. 10/229,953 filed Aug. 27, 2002, Ser. No. 10/229,954 filed Aug. 27, 2002, Ser. No. 10/229,955 filed Aug. 27, 2002, Ser. No. 10/229,956 filed Aug. 27, 2002 and Ser. No. 10/371,618, filed Feb. 22, 2003, now U.S. Pat. No. 6,730,900. The present invention relates to image sensors and in particular to MOS and CMOS based image sensors.

BACKGROUND OF THE INVENTION

A typical electronic image sensor is comprised of an array of a large number of very small light detectors, together called a "pixel array". These sensors typically generate electronic signals representative of each pixel that have amplitudes that are proportional to the intensity of the light received by each of the detectors in the array. In electronic cameras imaging components produce an optical image of a scene onto the pixel array. The electronic image sensor converts the optical image into a set of electronic signals. These electronic cameras typically include components for conditioning and processing the electronic signals to allow images to be converted into a digital format so that a digital processor can process the images, which can then be stored, transmitted digitally and or displayed. Various types of semiconductor devices can be used for acquiring the image. These include charge couple devices (CCD's), photodiode arrays and charge injection devices. The most popular electronic image sensors utilize arrays of CCD detectors for converting light into electrical signals. These detectors have been available for many years and the CCD technology is mature and well developed. One big drawback with CCD's is that the technique for producing CCD's is incompatible with other integrated circuit technology such as metal oxide semiconductor (MOS) and complementary metal oxide semi-conductor (CMOS) technology, so that processing circuits for the CCD arrays must be produced on chips separate from the CCD's.

Another currently available type of image sensors is based on MOS technology or CMOS technology. These sensors typically have multiple transistors within each pixel. The most common CMOS sensors have photo-sensing circuitry and active circuitry designed in each pixel cell. They are called active pixel sensors (APS's). The active circuitry consists of multiple transistors that are inter-connected by metal lines; as a result, the area occupied by the circuitry is opaque to visible light and cannot be used for photo-sensing. Thus, each pixel cell typically comprises photosensitive and non-photosensitive circuitry. In addition to circuitry associated with each pixel cell, CMOS sensors have other digital and analog signal processing circuitry, such as sample-and-hold amplifiers, analog-to-digital converters and digital signal processing logic circuitry, all integrated as a monolithic device. Both pixel arrays and other digital and analog circuitry are fabricated using the same basic process sequences.

Small cameras using CCD sensors typically consume large amounts of energy (as compared to cameras with CMOS sensors) and require high rail-to-rail voltage swings to operate CCD. This can pose problems for today's mobile appliances, such as Cellular Phone and Personal Digital Assistant. On the other hand, small cameras using CMOS sensors may provide a solution for energy consumption; but the traditional CMOS-based small cameras suffer low light sensing performance, which is intrinsic to the nature of CMOS APS sensors caused by shallow junction depth in the silicon substrate and its active transistor circuitry taking away the real estate preciously needed for photo-sensing.

U.S. Pat. Nos. 5,528,043; 5,886,353; 5,998,794 and 6,163,030 are examples of prior art patents utilizing CMOS circuits for imaging. These patents have been licensed to Applicants' employer. U.S. Pat. No. 5,528,043 describes an X-ray detector utilizing a CMOS sensor array with readout circuits on a single chip. In that example image processing is handled by a separate processor. U.S. Pat. No. 5,886,353 describes a generic pixel architecture using a hydrogenated amorphous silicon layer structure, either p-i-n or p-n or other derivatives, in conjunction with CMOS circuits to for the pixel arrays. U.S. Pat. Nos. 5,998,794 and 6,163,030 describe various ways of making electrical contact to the underlying CMOS circuits in a pixel. All of the above US patents are incorporated herein by reference.

Combining CMOS and MOS sensors with external processors can result in complexity and increase production costs. A need exists for improved image sensor technology which can provide image sensors with cost, quality, performance and size improvements over prior art sensors.

SUMMARY OF THE INVENTION

The present invention provides novel MOS or CMOS based photoconductor on active pixel image sensor. Thin layers of semi-conductor material, doped to PIN or NIP photoconducting layers, located above MOS and/or CMOS pixel circuits produce an array of layered photodiodes. Positive and negative charges produced in the layered photodiodes are collected and stored as electrical charges in the MOS and/or CMOS pixel circuits. The present invention also provides additional MOS or CMOS circuits for reading out the charges and for converting the charges into images. With the layered photodiode of each pixel fabricated as continuous layers of charge generating material on top of the MOS and/or CMOS pixel circuits, extremely small pixels are possible with almost 100 percent packing factors. MOS and CMOS fabrication techniques permit sensor fabrication at very low costs. In preferred embodiments all of the sensor circuits are incorporated on or in a single crystalline substrate along with the sensor pixel circuits. Techniques are disclosed for tailoring the spectral response of the sensor for particular applications. For example, in preferred embodiments the spectral range of the sensors can be adapted to cover ultraviolet and near infrared as well as the visible range or any portion of this broad range. Some preferred embodiments of the present invention include additional features to minimize cross talk between pixels. These additional features include a gate bias transistor at each pixel that maintains the charge-collecting element of each pixel at approximately the same electrical potential. In other embodiments semi-conductor material that surrounds charge collecting elements is doped with carbon to increase its electrical resistance. Embodiments provide quantum efficiencies greater than 50 percent and extremely fast response times of a few hundred microseconds or less.

In particular preferred embodiments the sensor is a 0.3 mega-pixel (3.2 mm×2.4 mm, 640×480) array of 5-micron square pixels that is compatible with a lens of $\frac{1}{4.5}$ inch optical format. In these preferred embodiments the sensor along with focusing optics is incorporated into a cellular phone camera to permit transmission of visual images along with the voice communication. The result is an extremely low cost camera at high volume production that can be made extremely small (e.g., smaller than the human eye). High volume production costs for the above 0.3 mega-pixel camera are projected to be less than $10 per camera. Preferred embodiments also include infrared and ultraviolet cameras with high quantum efficiencies and fast response times and large pixel arrays such as a 2 million-pixel high definition television format sensor.

BRIEF DESCRIPTION OF THE DRAWINGS

FIG. 4 is a cross-sectional diagram illustrating a sensor with a photodiode array consisting of photo-conducting layers on an active pixel array of CMOS circuit elements.

FIG. 16A is a cross-sectional diagram illustrating a PBIN sensor utilizing a metal pad;

FIG. 18A is a cross-sectional diagram illustrating one embodiment of a NIBP sensor according to the present invention;

FIG. 18B is a cross-sectional diagram illustrating an alternative embodiment of a NIBP sensor utilizing a metal pad;

FIG. 18C is a cross-sectional diagram illustrating another alternative embodiment of a NIBP sensor;

FIG. 26 is a schematic diagram of exemplary circuitry that may be used for an individual pixel cell having a PBIN diode structure, without the use of a gate bias transistor;

FIG. 27 is a schematic diagram of exemplary circuitry that may be used for an individual pixel cell having a NIBP diode structure, without the use of a gate bias transistor;

DETAILED DESCRIPTION OF A PREFERRED EMBODIMENT

First Preferred Embodiment

Figure 1C:
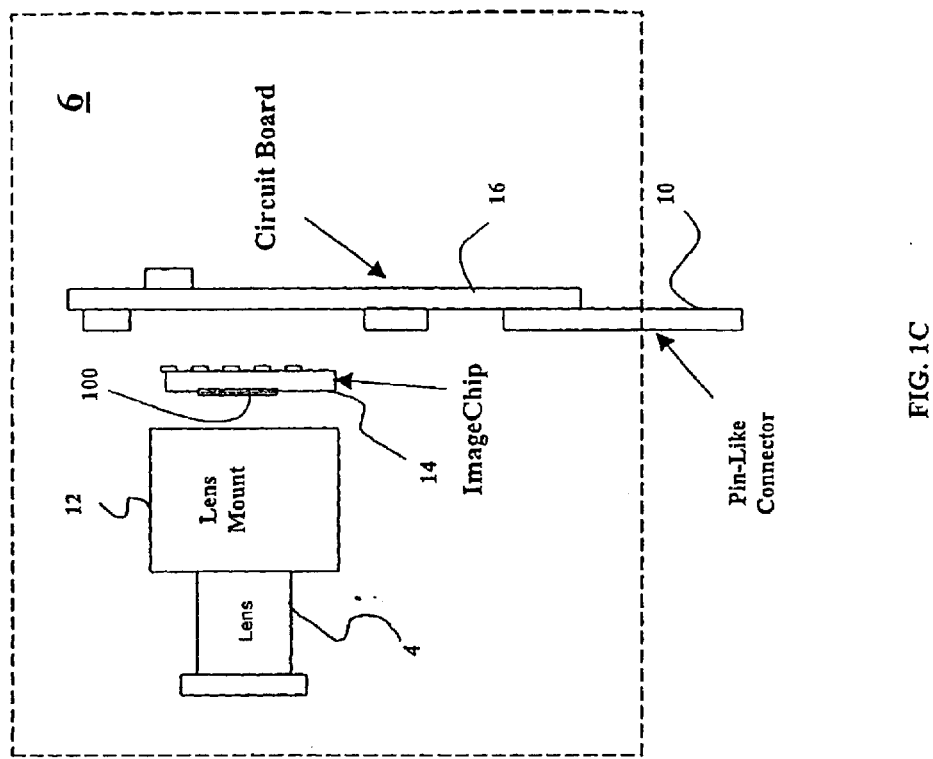
FIG. 1C shows some details of the camera.
Figure 1A:
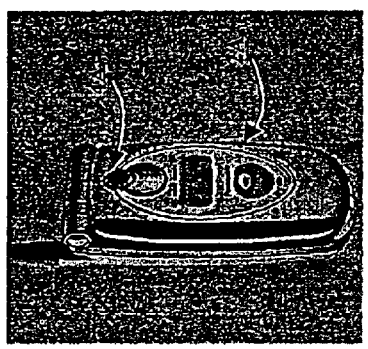
FIGS. 1A and 1B are drawings of cellular phones each equipped with a camera utilizing a CMOS sensor array according to the present invention.
Figure 1B:
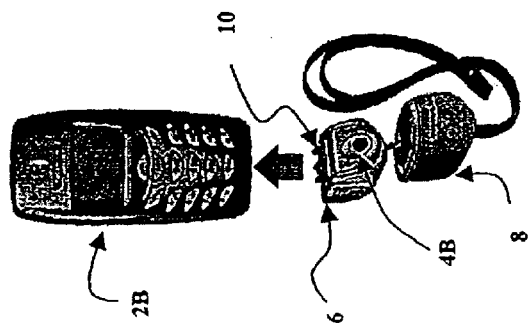

Single Chip Camera with Photo Conductor on Active Pixel Sensor A preferred embodiment of the present invention is a single chip camera with a sensor consisting of a photodiode array consisting of photoconductive layers on top of an active array of CMOS circuits. (Applicants refer to this sensor as a "POAP Sensor" the "POAP" referring to "Photoconductor On Active Pixel".) In this particular POAP sensor there are 307,200 pixels arranged in as a 640×480 pixel array and there is a transparent electrode on top of the photoconductive layers. The pixels are 5 microns×5 microns and the packing fraction is approximately 100 percent. The active dimensions of the sensor are 3.2 mm×2.4 mm and a preferred lens unit is a standard lens with a 1/4.5 inch optical format. A preferred application of the camera is as a component of a cellular phone as shown in FIGS. 1A and 1B. In the 1A drawing the camera is an integral part of the phone 2A and the lens is shown at 4A. In the 1B drawing the camera 6 is separated from the phone 2B and connected to it through the 3 pin-like connectors 10. The lens of the camera is shown at 4B and a camera protective cover is shown at 8. FIG. 1C is a block diagram showing the major features of the camera 4B shown in the 1B drawing. They are lens 4, lens mount 12, image chip 14, sensor pixel array 100, circuit board 16, and pin-like connector 10.

CMOS Sensor

The sensor pixel array is implemented with a photoconductor on active pixel array, readout circuitry, readout timing/control circuitry, sensor timing/control circuitry and analog-to-digital conversion circuitry. The sensor includes:

1. A CMOS-based pixel array comprises 640×480 charge collectors and 640×480 CMOS pixel circuits and
2. A CMOS readout circuit including A to D conversion and timing control circuitry.

The sensor array is similar to the visible light sensor array described in U.S. Pat. No. 5,886,353 referred to in the Background section (see especially text at columns 19 through 21 and FIG. 27) that is incorporated by reference herein. Details of various sensor arrays are also described in the parent patent applications referred to in the first sentence of this specification all of which have also been incorporated herein by reference. FIGS. 2, 3A, 3B and 3C describe features of a preferred sensor array for this cell phone camera. The general layout of the sensor is shown at 100 in FIG. 2. The sensor includes pixel array 102 and readout and timing/control circuitry 104. FIG. 3A is a drawing showing the layered structure of a 5-pixel section of the pixel array.

Figure 3A:
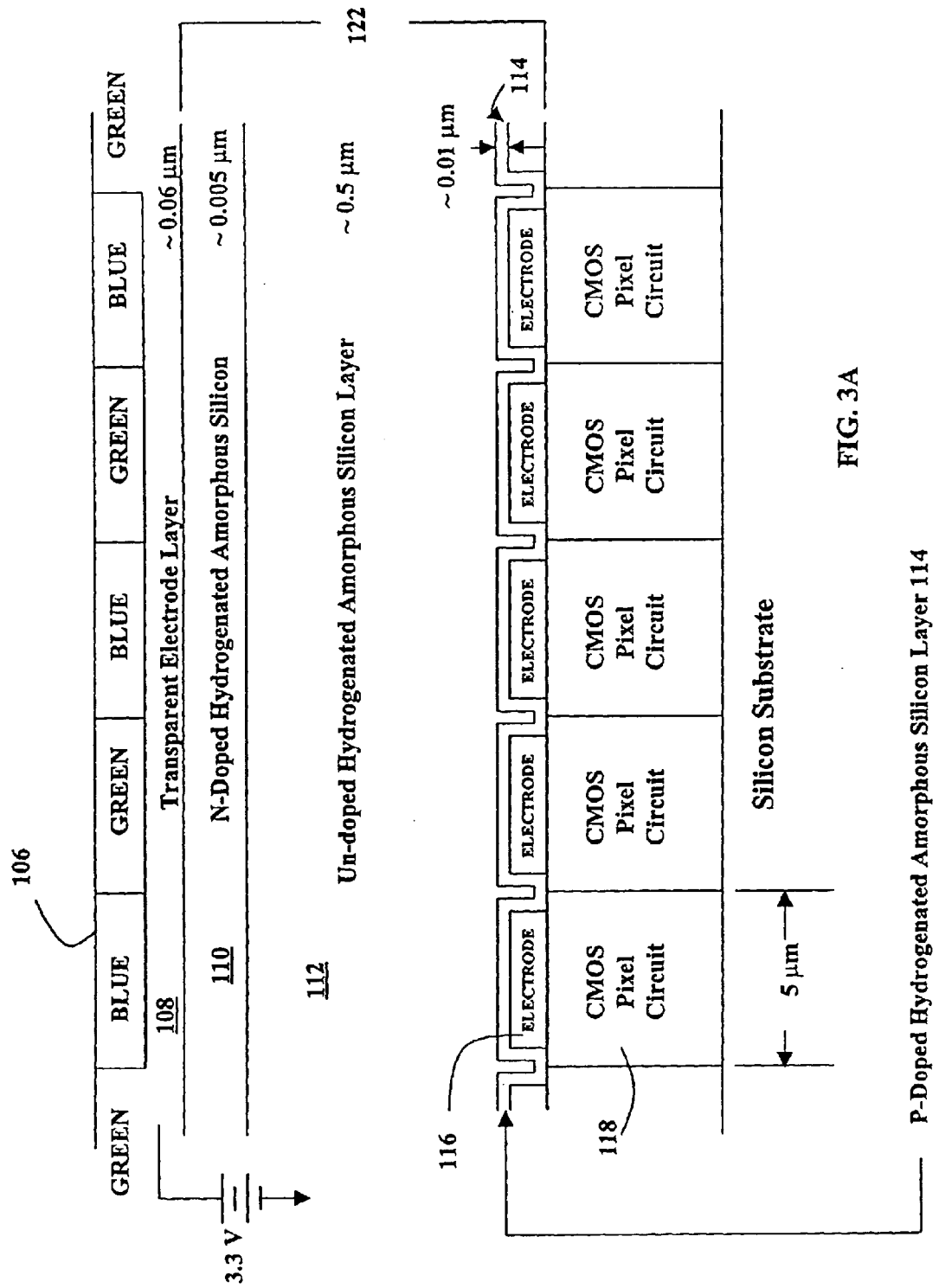
FIG. 3A is a partial cross-sectional diagram illustrating pixel cell architecture for five pixels of a sensor array utilizing principals of the present invention.
Figure 3C:
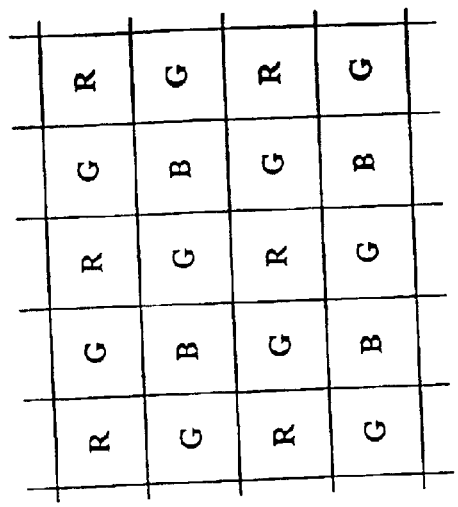
FIG. 3C shows a color filter grid pattern.

The sensor array is coated with color filters and each pixel is coated with only one color filter to limit transmission to only one component of the color spectrum. The preferred color filter set is comprised of three broadband color filters with peak transmission at 450 nm (B), 550 nm (G) and 630 nm (R), respectively. The full width at half maximum of the color filters is about 50 nm for Blue and Green filters. The Red filter typically permits transmission all the way into near infrared. For visible image application, an IR cut-off filter needs to be used to tailor the Red response to be peaked at 630 nm with about 50 nm full width at half maximum. These filters are used for visible light sensing applications. Four pixels are formed as a quadruplet, as shown in FIG. 3C. Two of the four pixels are coated with color filter of peak transmission at 550 nm, they are referred as "Green pixels". One pixel is coated with color filter with peak at 450 nm (Blue pixel) and one with filter peaked at 630 nm (Red pixel). The two Green pixels are placed at the upper-right and lower-left quadrants. A Red pixel is placed at the upper-left quadrant and a Blue pixel is placed at lower-right quadrant. The color-filter-coated quadruplets are repeated for the entire 640×480 array. FIG. 3A shows a top filter layer 106 in which the green and blue filters alternate across a row of pixels.

Beneath the filter layer is a transparent surface electrode layer 108 comprised of about 0.06 micron thick layer of indium tin oxide which is electrically conductive and transmissive to visible light.

Photoconductive Layer

In FIG. 3A, below the conductive surface electrode layer is a photoconductive layer comprised of three sub-layers. The uppermost sub-layer is an about 0.005 micron thick layer 110 of n-doped hydrogenated amorphous silicon. Under that layer is an about 0.5 micron layer 112 of un-doped hydrogenated-amorphous silicon. This 112 layer is referred to by Applicants as an "intrinsic" layer. This intrinsic layer is one that displays high electrical resistivity unless it is illuminated by photons. Under the un-doped layer is an about 0.01 micron layer 114 of high-resistivity P-doped hydrogenated-amorphous silicon. Preferred doping concentrations are in the range of about $10^{20}$ atoms/$cm^3$ of phosphorus for N doping and in the range of about $10^{20}$/$cm^3$ of boron for P doping. These three hydrogenated amorphous silicon layers produce a diode effect above each pixel circuit. Applicants refer to these layers as an N-I-P or a P-I-N photoconductive layer.

PIN and NIP Layers

The laying down of intrinsic and doped layers of photoconductive material on top of active MOS and/or CMOS circuits is a very important element of the present invention. The reader should understand that the order of the layers can be reversed from that described above. That is, the layer adjacent to the transparent upper electrode layer 108 could be a p-doped layer and the layer adjacent to the pixel electrodes in this case would be an n-layer. An intrinsic layer is located between the p-layer and the n-layer. Most of the charge pairs are produced in this i-layer. Applicants in this specification and in the claims will refer to the layers in descending order, i.e., where the p-layer is closer to the transparent upper electrode layer and the n-layer is closer to the pixel electrodes, the photoelectric layer will be referred to as a PIN photoelectric layer (or a PIN layer) and in the reverse situation the configuration will be referred to as an NIP photoelectric layer (or as an NIP layer). For example, the photoelectric layer shown in FIG. 3A embodiment is an NIP layer. The layer in the FIG. 4 embodiment is a PIN layer. In some embodiments described in detail below Applicants have added a barrier layer (similar to the i-layer but much thinner and doped slightly with carbon) in between the p-layer and the i-layer and these photoelectric layers are referred to a PBIN layer or an NIBP layer. Techniques for laying down these layers are described below.

Figure 3B:
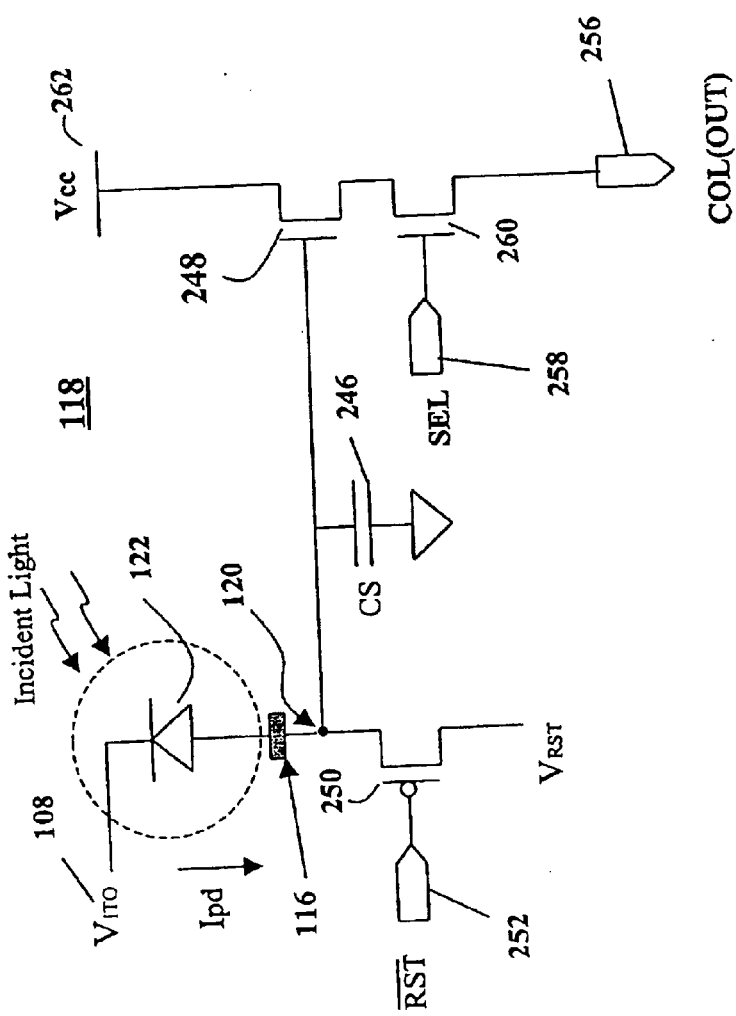
FIG. 3B shows CMOS pixel circuitry for a single pixel.

In the preferred embodiments described in detail in this specification, all photoelectric layers are reverse biased, thus, for the typical NIP configuration such as the FIG. 3A embodiment, a positive bias charge such as +3.3 V is applied to the transparent top conductive layer and the pixel capacitors are grounded through a reset transistor during reset operations preceding each charge accumulation (charge integration) stage. During charge integration, positive charges created in the photoconductive layer flow to pixel capacitor 246 to increase its potential. Fast responding transistors read the increased potential. After the charge or the capacitors are read, the capacitors are grounded through a reset transistor. The reset operation reduces the voltage on the pixel capacitor (246 as shown in FIG. 3B) to the transistor threshold voltage which is about 0.7 Volts.

Figure 5:
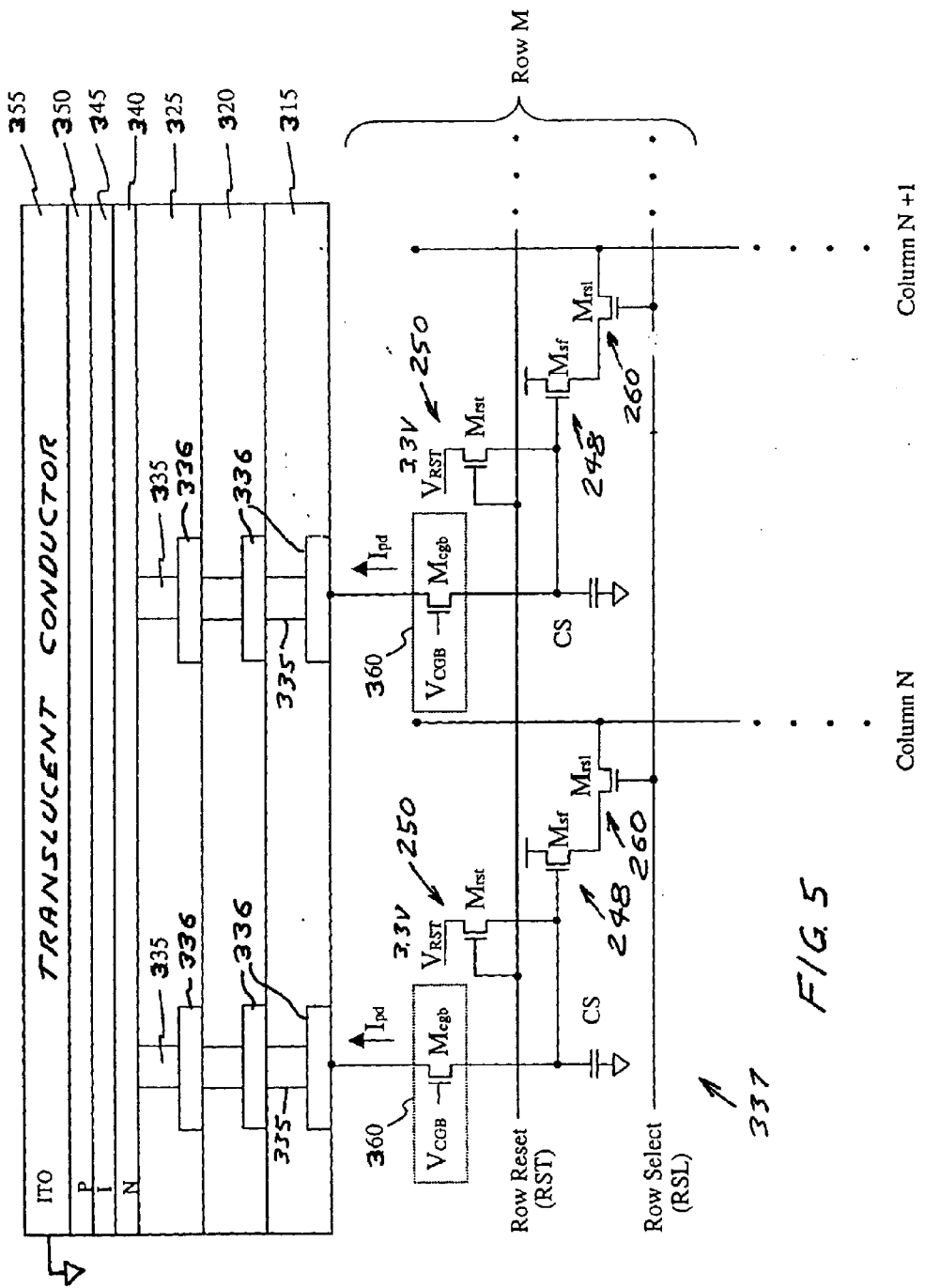
FIG. 5 is a cross-sectional diagram illustrating a first embodiment of the POAP sensor of the present invention, as well as some of the related pixel cell circuitry that may be used to support a PIN photodiode architecture.

For the PIN configurations such as described in FIGS. 5 and 6A, transparent electrode 355 is grounded and the pixel capacitor is charged positive at about 2.7 Volts during each reset operation. During integration in this case, negative charges current resulting from charges created in the PIN photodiode layers flow to the pixel capacitors to partially discharge them. Positive charges flow to transparent electrode 355 and from there to ground. In this case, the decrease in the voltage on the pixel capacitor is the measure of illumination detected by the pixel during the integration period. After the decrease in charge is read, the pixel separate capacitor is charged up again during the reset step to about 2.7 Volts.

Carbon atoms or molecules in the range of about $10^{22}$ atoms/cm$^3$ may be added to layer 114 in FIG. 3A to increase electrical resistance. This minimizes the lateral cross talk among pixels and the corresponding loss of spatial resolution. This PIN photoconductive layer is not lithographically patterned, but (in the horizontal plane) is a homogeneous film structure. This simplifies the manufacturing process. Within the sub-layer 114 are 307,200 4.6×4.6 micron electrodes 116 which define the 307,200 pixels in this preferred sensor array. Electrodes 116 are made of titanium nitride (TiN). Just below the electrodes 116 are CMOS pixel circuits 118. The electrodes 116 are referred by Applicants as "pixel electrodes" or "collection electrodes" in the text. These pixel collection electrodes are used in conjunction with the top transparent electrode to supply a voltage drop across the photoconductive layer to enable photo-generated charges flow onto the storage capacitors. The components of pixel circuits 118 are described by reference to FIG. 3B. The CMOS pixel circuits 118 utilize three transistors 250, 248 and 260. The operation of a similar three transistor pixel circuit is described in detail in U.S. Pat. No. 5,886,353. This circuit is used in this embodiment to achieve maximum saving in chip area. Other more elaborate readout circuits are described in the parent patent applications referred to in the first sentence of this specification and in other embodiments described in detail below in this specification. Pixel collection electrode 116, also comprised of TiN, shown in FIG. 3A, is connected to the charge-collecting node 120 as shown in FIG. 3B. Pixel circuit 118 includes collection electrode 116, collection capacitor 246, source follower buffer transistor 248, selection transistor 260, and reset transistor 250. Pixel circuit 118 uses p-channel transistors for reset transistor 250 and an n-channel transistor for source follower transistor 248 and selection transistor 260. The voltage at COL (out) 256 is proportional to the charge Q(in) stored on the collection capacitor 246. By reading this node twice, once after the exposure to light and once after the reset, the voltage difference is a direct proportional to the amount of light being detected by the photo-sensing structure 122. Pixel circuit 118 is referenced to a positive voltage Vcc at node 262 (typically 2.5 to 5 Volts). Pixel circuitry for this array is described in detail in the '353 patent. Various integrated circuit lithography techniques which may be used for fabricating the components of the FIG. 3B sensors are described in detail the '353 patent and in connection with other embodiments in the following sections of this specification.

Other Camera Features

Figure 2:
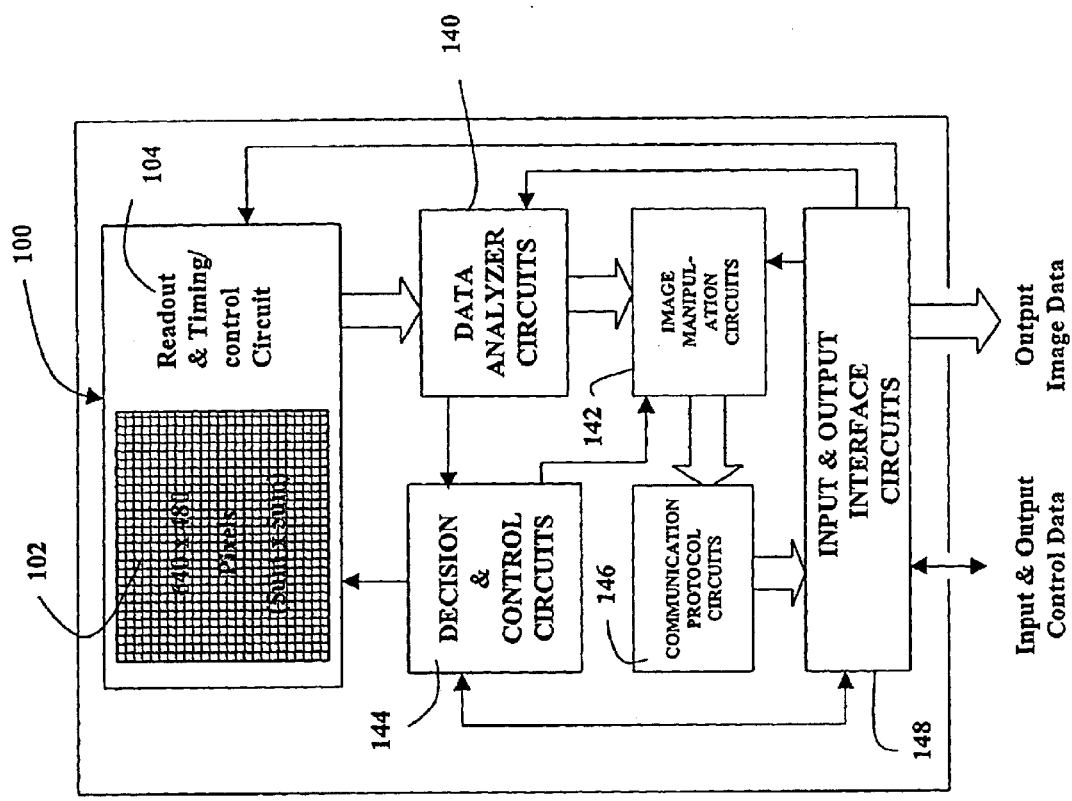
FIG. 2 shows some details of a CMOS integrated circuit utilizing some of the principals of the present invention.

In this preferred embodiment, as shown in FIG. 2 additional MOS or CMOS circuits for converting the charges into electrical signal, for amplifying the signals, for converting analog signal into digital signal and for digital signal processing are provided on the same crystalline substrate utilized for the collection of the charges. The data out of the sensor section 100 is in digital form and with a pixel-sequential stream. The sensor chip area includes a standard clock generation feature (not shown here but described in the '353 patent referred to in the Background section). From it, signals representing the start of frame, start of line, end of a frame, end of line and pixel are distributed into all sections on the image chip to synchronize the data flow.

Environmental Analyzer Circuits

The data out of the sensor section is fed into an data analyzer circuit 140 where image's statistics are calculated. The sensor region is preferably partitioned into separate sub-regions, with the average or mean signal within the region being compared to the individual signals within that region in order to identify characteristics of the image data. For instance, the following characteristics of the lighting environment are measured:

1. light source brightness at the image plane
2. light source spectral composition for white balance purpose
3. imaging object reflectance
4. imaging object reflectance spectrum
5. imaging object reflectance uniformity The measured image characteristics are provided to decision and control circuits 144. The image data passing through a data analyzer circuit 140 are preferably not modified by it at all. In this embodiment, measured image characteristics include the mean of the first primary color signal among all pixels, the mean of the second primary color signal, the mean of the third primary color signal and the mean of the luminance signal. This circuit will not alter the data in any way but will calculate the data statistical values and pass the original data to image manipulation circuits 142. Other statistical information, such as maximum and minimum will be calculated as well. These values can be useful in terms of telling the range of the object reflectance and lighting condition. The statistics for color information is preferably on full image basis, but the statistics of luminance signal is preferably on a per sub-image regions basis. This implementation permits the use of a weighted average to emphasize the importance of one selected sub-image, such as the center area.

Decision & Control Circuits

Image parameter signals received from the data analyzer 140 are used by the decision and control circuits 144 to auto-exposure and auto-white-balance controls and to evaluate the quality of the image being sensed, and based on this evaluation, the control components (1) provide feedback to sensor 100 to change certain modifiable aspects of the image data provided by the sensor, and (2) provide control signals and parameters to image manipulation circuits 142. The change can be sub-image based or full-image based. Feedback from the control circuits 144 to the sensor 100 provides active control of the sensor elements (substrate, image absorption layer, and readout circuitry) in order to optimize the characteristics of the image data. Specifically, the feedback control provides the ability to program the sensor to change operation (or control parameters) of the sensor elements. The control signals and parameters provided to the image manipulation circuits 142 may include certain corrective changes to be made to the image data before outputting the data from the camera.

Image Manipulation Circuits

Image manipulation circuits 142 receive the image data from the data analyzer and, with consideration to the control signals received from the control module, provides an output image data signal in which the image data is optimized to parameters based on a control algorithm. In these circuits according to the algorithm, pixel-by-pixel image data are processed so each pixel is represented by three color-primaries. Color saturation, color hue, contrast, brightness can be adjusted to achieve desirable image quality. The image manipulation circuits provide color interpolation among each pixel and adjacent pixels with color filters of the same kind so each pixel can be represented by three color components. This provides enough information with respect to each pixel so that the sensor can produce a human perception of color for each pixel. It can also do color adjustment so any desired difference between the color response of sensors and human vision can be optimized.

Communication Protocol Circuits

Communication protocol circuits 146 rearrange the image data received from image manipulation circuits to comply with communication protocols, either industrial standard or proprietary, needed for a down-stream device. The protocols can be in bit-serial or bit-parallel format. Preferably, communication protocol circuits 146 convert the process image data into luminance and chrominance components, such as described in ITU-R BT.601-4 standard. With this data protocol, the output from the image chip can be readily used with other components in the market place. Other protocols may be used for specific applications.

Input & Output Interface Circuits

Input and output interface circuits 148 receive data from the communication protocol circuits 146 and convert them into the electrical signals that can be detected and recognized by the down-stream device. In this preferred embodiment, the input & output Interface circuits 148 provide the circuitry to allow external to get the data from the image chip, read and write information from/to the image chip's programmable parametric section.

Chip Package

The image chip is packaged into an 8 mm×8 mm plastic chip carrier with glass cover. Depending upon the economics and applications, other type and size of chip carrier can be used. The glass-cover can be replaced by other types of transparent materials. The glass cover can be coated with an anti-reflectance coating, and/or an infrared cut-off filter. In an alternative embodiment, this glass cover is not needed if the module is hermetically sealed with a substrate on which the image chip is mounted, and assembled in a high quality clean room with lens mount as the cover.

The Camera

Lens 4 shown in FIG. 1C is based on a 1/4.5" F./2.8 optical format and has a fixed focal length with a focus range of 3-5 meters. Because of the smaller chip size, the entire camera module can be less than 10 mm (Length)×10 mm (Width)× 10 mm (Height). This is substantially smaller than the human eyeball! This compact module size is very suitable for portable appliances, such as a cellular phone. Lens mount 12 is made of black plastic to prevent light leak and internal reflectance. The image chip is inserted into the lens mount with unidirectional notches at four sides, to provide a single unit once the image chip is inserted in and securely fastened. This module has metal leads on the 8 mm×8 mm chip carrier that can be soldered onto a typical electronics circuit board.

Examples of Feedback & Control

Camera Exposure Control

Sensor 100 can be used as a photo-detector to determine the lighting condition. Since the sensor signal is directly proportional to the light sensed in each pixel, the camera can be calibrated to produce a "nominal" signal under a predetermined light level. When the signal is lower than the "nominal" value, it means that the ambient "lighting level" is lower than desirable. To bring the electrical signal back to "nominal" level, the pixel exposure time to light and/or the signal amplification factor in sensor or in the image manipulation module can be automatically adjusted. The camera may be programmed to partition the full image into sub-regions to be sure the change of operation can be made on a sub-region basis or to produce an effect weighted more on a region of interest.

Camera White Balance Control

The camera may be used under all kind of "light sources". Each light source may have a different spectral distribution. As a result, the signal out of the sensor may vary under different light sources. However, users may desire that the image be visualized similarly when displayed on various visualizing devices, such as print paper or cathode ray tube (CRT) display. This means that a variety of light sources (day light, flash light, tungsten light bulb, etc) should all be perceived as a white object. Since the sensor has pixels covered with primary color filters, the camera can be programmed to determine the relative intensity of the light source from the image data. The environmental analyzer is to get the statistics of the image and determine the spectral composition and make necessary parametric adjustment in the sensor operation or image manipulation to create a signal that can be displayed as it would be perceived by a human under white light.

OTHER POAP SENSOR PIXEL CELL ARRAYS

POAP Array with Reduced Cross Talk

FIG. 4 is a cross-sectional view of a preferred embodiment of a POAP sensor 300 with reduced cross talk. As shown, sensor 300 includes a substrate 310 and PIN layers 350, 345 and 340 similar to the sensor shown in FIG. 3A (except in the 3A sensor the order of the layers is reversed to provide an NIP layer). This FIG. 4 sensor in addition comprises lower, middle, and upper interconnection structures 315, 320, 325 successively formed over the substrate 310 and under the PIN layers. In this embodiment metal vias 335 function as pixel electrodes, which is connected through multiple interconnect structures to the underlying pixel circuitry. Each pixel of the array of pixel sensors includes vias 335, interconnect structures 315, 320 and metal lines 336 are formed on substrate 310. As will be described in detail herein, substrate 310 includes pixel cell circuitry. That circuitry in this embodiment includes additional features for reducing cross talk.

An n-layer 340 is formed adjacent to the upper interconnect structure 325. An i-layer 345 is formed adjacent to the n-layer 340, while a p-layer 350 is formed adjacent to the i-layer 345. The p-layer 350, the i-layer 345 and the n-layer 340 form a PIN layer that together with other elements described below form an array of PIN photodiode sensors, which will also be referred to herein as pixel sensors. Conductive vias 335 and metallization regions 336 electrically connect regions of the PIN layer to the pixel circuitry (not shown). A translucent conductive layer 355 is formed adjacent to the p-layer 350.

The lower and middle interconnection structures 315 and 320 are standard CMOS interconnection structures comprised preferably of very thin layers of insulator material such as $SiO_2$ with conducting structures passing through the insulator material. The CMOS interconnect structures include the vias 335 and metalization regions 336 which are shown on FIG. 4 and also include conducting structures (not shown), providing electrical connection among the pixel transistor located below the interconnect structures as shown at 337 in FIG. 5. The upper interconnection structure 325 is similar to layers 315 and 320 but preferably is thicker to provide reliability and structural support. The reader should understand that these layers are fabricated using well known integrated circuit fabrication processes and that these drawings such as FIG. 4 are not intended to describe detailed processes such as the production of metallization regions or techniques for producing vias. (For example vias are not normally placed on top of other vias.) The drawings do, however, show generally how the various components of the sensors are connected.

PIN layers 350, 345, and 340 are preferably fabricated with photosensitive materials, such as hydrogenated amorphous-silicon. Other potential material for fabricating the PIN layers include amorphous carbon, amorphous silicon carbide, amorphous germanium and amorphous silicon germanium. In preferred embodiments, the transparent conductor layer 355 may be formed from an indium tin oxide (ITO). However, other conductive materials may be used to form the transparent conductor layer 355, including tin oxide, titanium nitride, thin silicide, and the like. A protective layer (not shown) may also be formed over the transparent conductor 355.

Sensor Fabrication

The sensors of the present invention may be fabricated using any of many available CMOS (or MOS) fabrication processes. For example, well known 0.25 micron lithography processes can be utilized. With these 0.25-micron processes, 4 micron×4 micron pixel cells can be fabricated with nearly 100 percent fill factor. The CMOS pixel circuits shown in 118 in FIG. 3A and at 118 in FIG. 3B can be fabricated on silicon wafers using these standard lithography processes.

Interconnect structures are preferably also provided using standard integrated circuit techniques. These structures are preferably laid down in layers of about 0.25 microns on silicon wafers after the transistors shown in FIG. 5 have been fabricated. For example, the electrode 116 could be produced by sputtering of a metal layer about 0.2 micron thick followed by a photolithography resist and etch procedure. After excess metal has been removed by the etch step, the silicon dioxide layer 315 is applied using a CVD technique. Via 335 maybe applied using a photo-resist and etch process to create holes for the vias which are filed with a conductor material such as tungsten using a sputtering technique. The surface of the first layer is then smoothed out with a chemical mechanical polishing process after which another interconnect layer 320 is applied on top of the first layer 315 using the same or similar techniques. A third similar layer 325 is then provided on top of the second, each of the layers being about 0.5 micron thick. The photoconductor layers are then added by PECVD and the top conductor layer is added by sputtering.

POAP sensors of the present invention may include pixel cell arrays having a wide range of individual pixel cells. For example, the rows and columns of the pixel cell array may each be expanded or reduced to achieve a desired array size and configuration (e.g., 120×160, 256×256, 512×512, 1024× 1024, 2048×2048, and 4096×4096, etc.) However, the present invention is not limited to a particular size or geometry, and most any array configuration, up to and including the available maximum pixel density capabilities of the CMOS fabrication process may be used. The present invention further contemplates the modification of the size of individual pixel cells, as well as the modification of the size and geometries of the pixel cells arrays, to accommodate any lens cost limitations that may exist.

Four Transistor POAP Sensor Circuitry

FIGS. 5 and 6A are drawings showing features of a POAP image sensor utilizing four-transistor pixels. In particular, each pixel cell comprises the three transistors described in the first preferred embodiment: a reset transistor, 250; a source follower transistor, 248; and a row select transistor, 260. In this embodiment one additional transistor is provided; namely, a gate bias transistor, 360. The gate of the transistor 360 is shown biased by a gate voltage Vcgb. The transistor 360 is located between the pixel electrode 116 and the charge-sensing node 120. Illumination of photodiode 370, in FIG. 6A, with incident light produces plus and minus charges in the photoconductive layers which produces an effective current Ipd which partially discharges capacitor 346 without significantly changing the voltage potential of pixel electrode 116. Thus, gate transistor 360 effectively separates pixel electrode 330 from charge-sensing node CS during integration (i.e., the charge collection period). However, any current flow through the pixel circuit discharges capacitor CS to the same extent as in the FIG. 3B circuit.

Sensors such as the one shown in FIG. 3B that utilize a traditional three-transistor pixel cell configuration, and do not incorporate a gate transistor 360, will experience electrical potential differentials related to their respective light energies received. As a result, electrode 116 of adjacent pixel cells having a limited three-transistor configuration may experience potential differences of anywhere from about 100 millivolts to about 1000 millivolts (assuming supply voltages of about 3 Volts). The existence of such potential differences could result in undesirable pixel crosstalk and may increase image blurring. Therefore, if the gate transistor is not provided, other techniques should be considered such as increasing the electrical resistance of layer 114 (shown in FIG. 3A) or layer 340 (shown in FIG. 4). As explained above this can be done by adding carbon to the layer.

Figure 6:
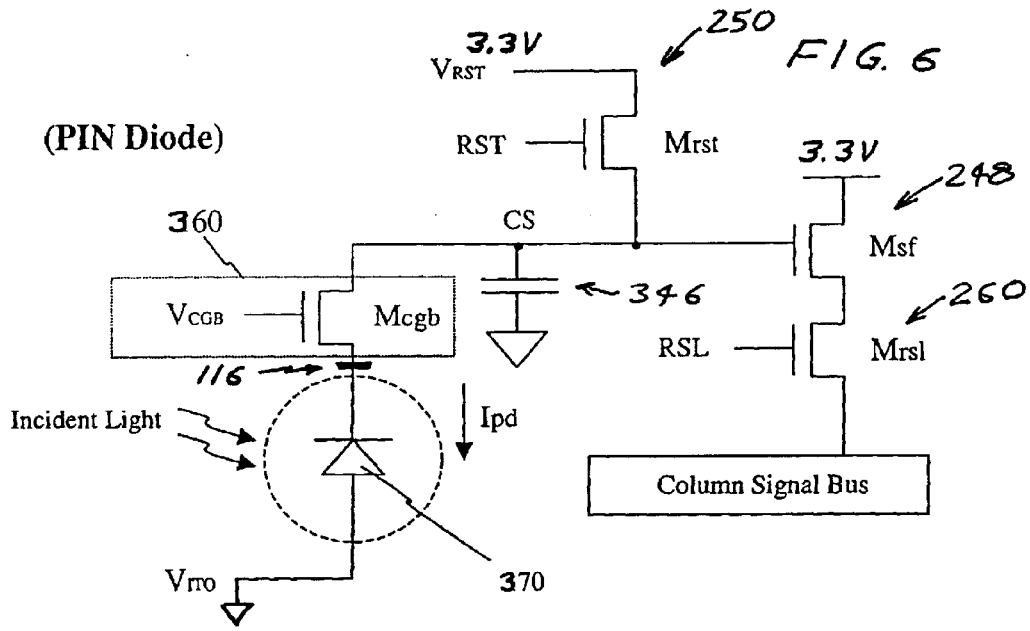
FIG. 6 is a schematic diagram of exemplary circuitry that may be used for an individual pixel cell having a PIN photodiode structure.

As shown in FIGS. 5 and 6 transistor 250 acts as a reset transistor whose gate is connected to the Row Reset RST (FIG. 5), and whose source is connected to gate transistor 360. A source follower transistor 248 comprises a gate that is connected to transistor Mcgb. Select transistor 260 comprises a gate that is connected to the Row Select RSL (FIG. 5), and a drain that is connected to the source of the source follower transistor 248. During the charge integration process, incident light strikes photodiode 370 effectively, creating a photocurrent flowing from that capacitor 246 through transistor 360. The photocurrent therefore discharges capacitor 246 to an extent related to the intensity of the incident light on the photodiode. However, as described above because of the constant gate voltage on transistor 360 the electrical potential at electrode 116 is not changed significantly by the discharge of capacitor 246.

Figure 7:
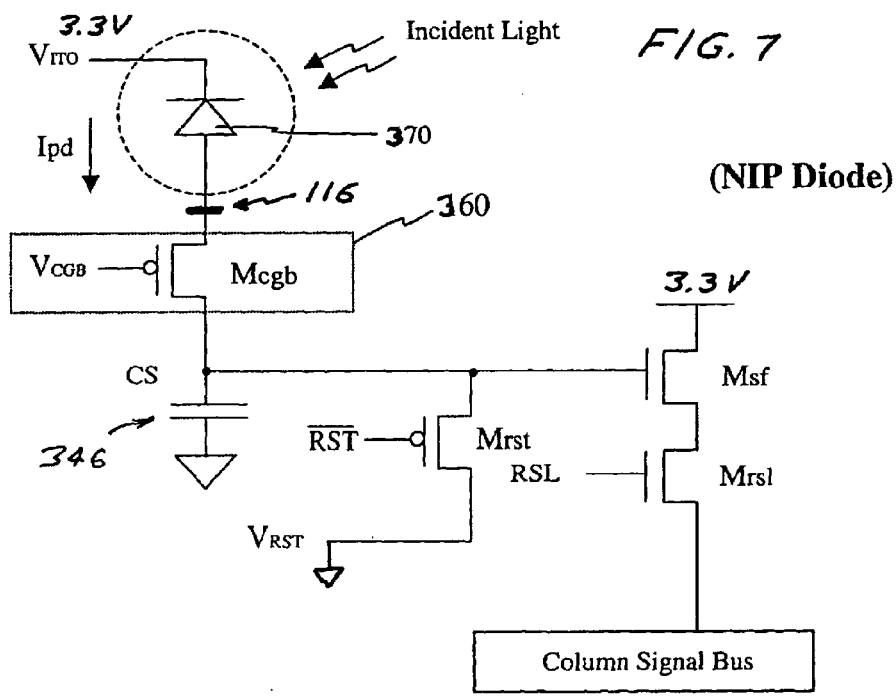
FIG. 7 is a schematic diagram of exemplary circuitry that may be used for an individual pixel cell having a NIP diode structure.

As previously described, the present invention may be fabricated as either a PIN or NIP diode structure. Accordingly, one of ordinary skill will realize that the individual pixel cell circuitry utilizing a PIN diode structure shown in FIG. 6 may be modified to accommodate a NIP diode structure. An example of such a construction is shown in FIG. 7. Referring now to FIG. 7, a schematic diagram of exemplary circuitry that may be used for an individual pixel cell having an NIP diode structure is shown. The various electrical components shown in this circuit are essentially similar to that shown in the PIN diode structure of FIG. 5, with modifications made to accommodate a NIP diode structure. For example, the photodiode 370 is shown inverted as compared to the configuration in FIG. 6. Also, the gate of the reset transistor 250 receives an inverted reset signal, denoted by signal $\overline{\text{RST}}$ which has the effect of grounding capacitor 246 through reset transistor 250, reducing the voltage on the capacitor to the threshold voltage of transistor 250 (about 0.7 Volt) during each reset operation. In the FIG. 7 circuit the $V_{ITO}$ on translucent electrode layer 355 is maintained at a constant supply voltage such as 3.3 Volts.

The present invention has been described as having a planar, or substantially planer, photoconductor layers (e.g., n-layer 340). However, alternative configurations are possible and within the contemplation of the present invention. For example, sensors may be modified to include non-planar photoconductor layers. By way of illustration, alternative embodiments of the present invention utilizing discontinuous, trenched, and patterned photoconductor layer configurations will now be described.

Discontinuous Photoconductor Layer

Figure 8:
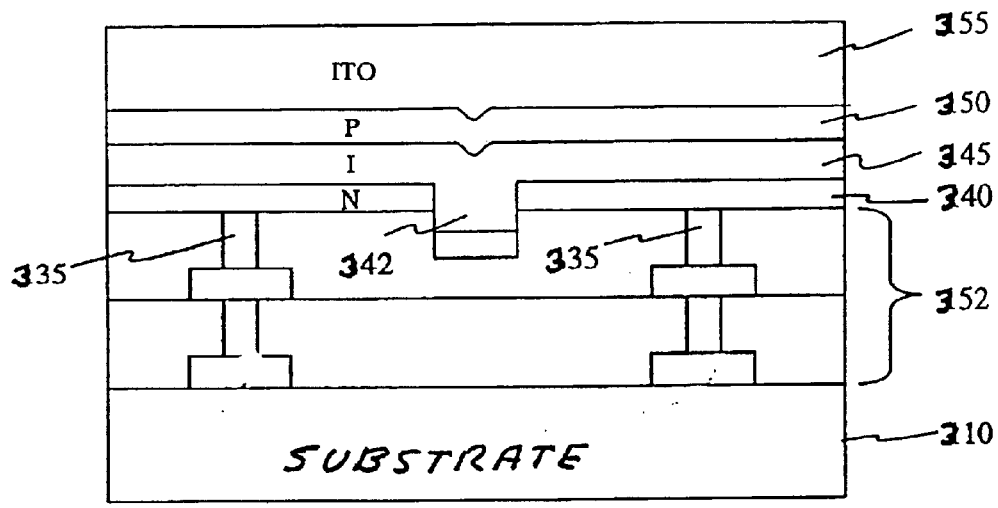
FIGS. 8 and 8A are a cross-sectional diagrams illustrating alternative embodiments of the POAP sensor of the present invention utilizing a discontinuous photoconductor layer design.
Figure 8A:
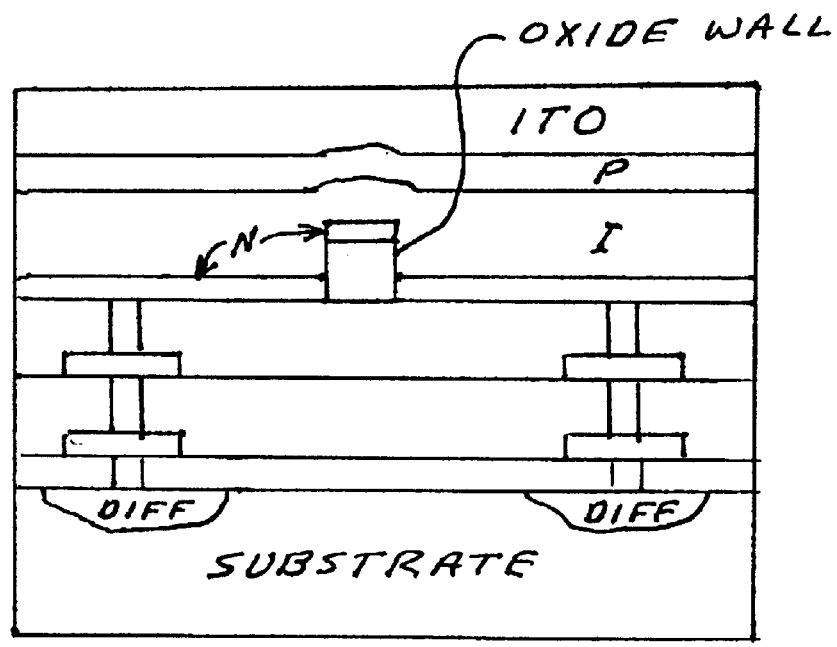

Referring now to FIG. 8, a cross-sectional view of an alternative embodiment of the POAP sensor of the present invention is shown and generally designated 400. Sensor 400 is similar to sensors 100 and 300 in many respects, and may include a substrate 310 (with its pixel circuits) and a multi-tiered interconnection structure 352 formed over the substrate 310. Sensor 400 further includes conductive layer 355, p-layer 350, i-layer 345, and n-layer 340. Again, substrate 310 may include pixel cell circuitry that provides, for example, for the reduction or elimination of pixel cross talk. A notable distinction between sensor 300 and sensor 400 relates to the lowest photoconductive layer (e.g. the n-layer in a PIN diode, or the p-layer in a NIP diode) that is in electrical communication with the conductive vias 335. In particular, sensor 400 is shown having a discontinuous n-layer 340 created by a trench 342 that is present between adjacent pixel electrodes 335. The trench configuration typically provides an additional degree of electrical isolation between adjacent pixels, because the material of intrinsic layer 345 has higher electrical resistivity than that of n layer 340. However, because the discontinuous n-layer 340 of sensor 400 may be utilized in conjunction with pixel cell circuitry previously described, a sensor having even greater reduction in pixel cross talk is possible without substantial reduction in fill factor. A variation of the FIG. 8 embodiment is shown in FIG. 8A. There as opposed to using a trench, Applicants us a raised SiO₂ wall to create a discontinuous n-layer. The $SiO_2$ wall can be deposited and etched like other inter-metal dielectric layers.

Trenched Layer

Figure 9:
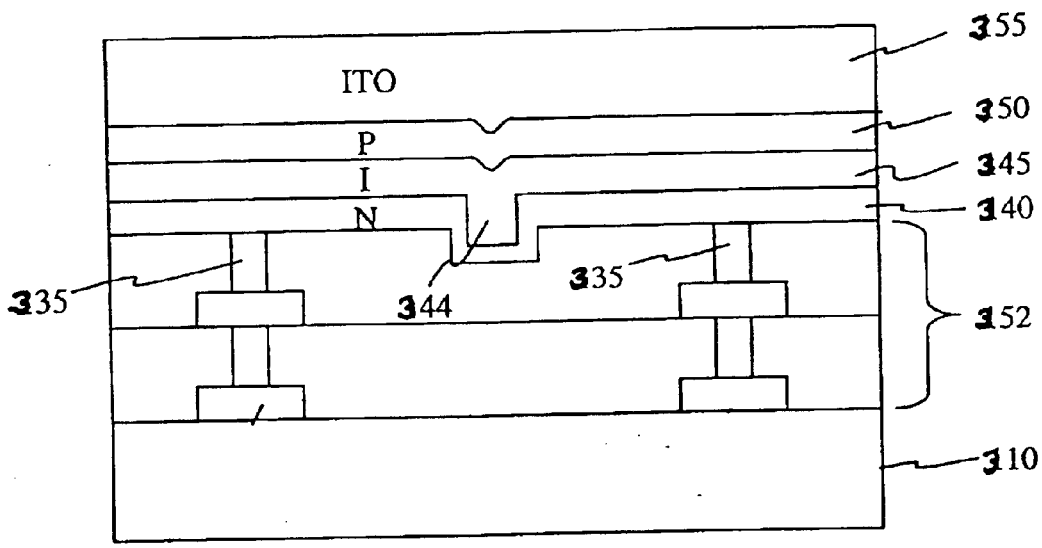
FIG. 9 is a cross-sectional diagram illustrating another alternative embodiment of the POAP sensor of the present invention utilizing a trenched photoconductor layer design.

Referring now to FIG. 9, a cross-sectional view of another alternative embodiment of the POAP sensor of the present invention is shown and generally designated 500. Sensor 500 is similar to sensor 400 in many respects. Similarly to the trench design utilized in sensor 400, the sensor 500 also comprises a trench 344 between adjacent pixel electrodes 335. However, trench 344 is not as pronounced as trench 342 (sensor 400). In sensor 500 the n-layer 340 is continuous, in contrast to the discontinuous N-layer utilized by sensor 400. The trench configuration shown in FIG. 9 typically provides some degree of isolation between the pixel cells by increasing the resistance between the n-layers associated with neighboring pixels.

Patterned Layer

Figure 10:
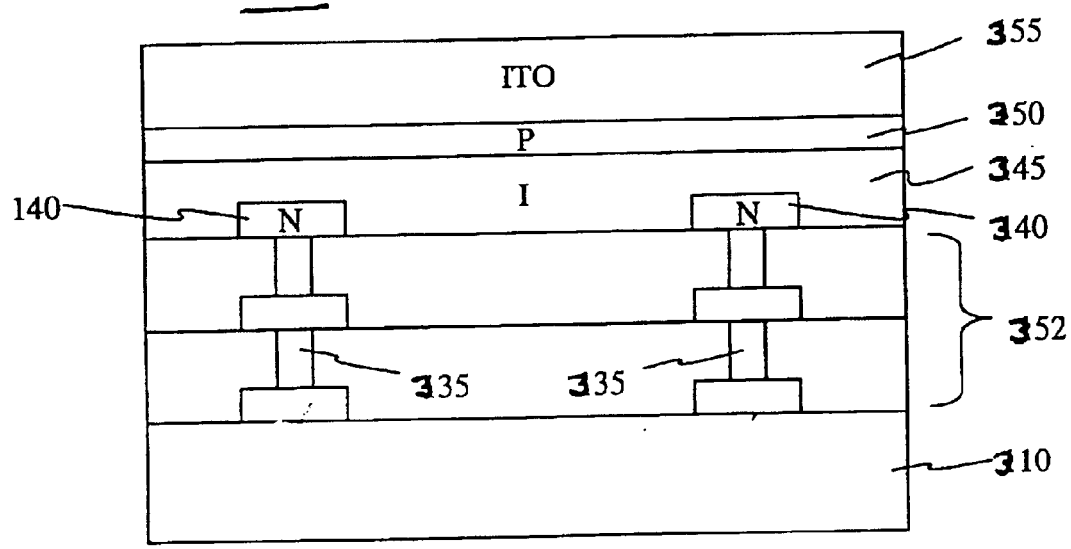
FIG. 10 is a cross-sectional diagram illustrating another alternative embodiment of the POAP sensor of the present invention utilizing a patterned photoconductor layer design.

Referring now to FIG. 10, a cross-sectional view of still another alternative embodiment of the POAP sensor of the present invention is shown and generally designated 600. Sensor 600 is similar to sensor 500 in many respects, such that sensor 600 may include a substrate 310 and a multi-tiered interconnection structure 352 formed over the substrate 310. Similarly to the other sensors previously described, sensor 600 further includes conductive layer 355, P-layer 350, I-layer 345. However, in contrast to the other sensors, the sensor 600 also comprises a patterned N-layer 340, as opposed to the trench designs utilized by sensors 400 and 500. The patterned configuration shown in FIG. 10 typically provides a degree of electrical isolation between adjacent pixel cells. However, in some applications, the electrical isolation provided solely by the patterning of the N-layer 340 may not be sufficient. If so sensor 600 may be configured with the previously described pixel cell circuitry including a gate bias transistor (such as transistor 360 shown in FIG. 5) so that a desired level of pixel cell isolation may be obtained.

Alternate Architectures

The individual pixel cells utilized in the present invention have been described as utilizing a three-transistor or four-transistor pixel cell architecture. However, alternative architectures are possible and within the contemplation of the present invention. For example, the pixel cell circuitry utilized in the sensor of the present invention may include anywhere from two to six transistors, or even more. By way of illustration, alternative pixel cell architectures that may be used to maintain even greater potential uniformity over the array of pixel electrodes will now be described.

Six Transistor Pixel Cell

Figure 11:
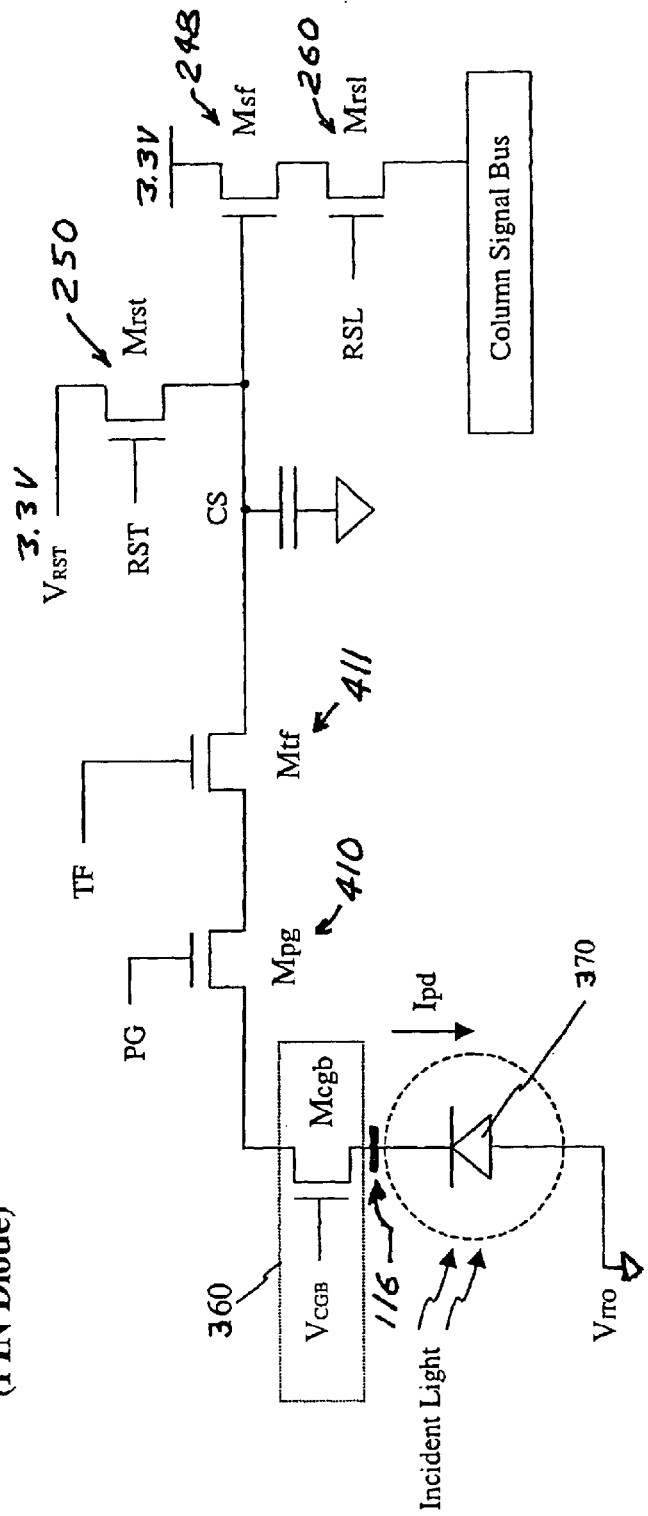
FIG. 11 is a schematic diagram of exemplary circuitry utilizing a six transistor architecture that may be used for an individual pixel cell having a PIN diode structure.

FIG. 11 is a schematic diagram of exemplary circuitry for a six-transistor pixel cell that may be used for individual pixel cells having a PIN diode structure. The circuitry shown in FIG. 11 is similar in many respects to that shown in FIG. 6. However, the circuitry in FIG. 11 comprises two additional transistors (i.e., transistors Mpg and Mtf) as compared to the FIG. 6 design. In FIG. 11, the transistor Mcgb is shown biased by a constant gate voltage Vcgb, so that each electrode 116 of an array of pixel electrodes may be maintained at approximately the same electrical potential. The reset transistor Mrst, the source follower transistor Msf, the row-select transistor Mrsl, as well as the gate bias transistor Mcgb function similarly as in the four-transistor pixel cell described above (FIG. 6). A fifth transistor Mpg 410, the photogate transistor, may be used as a MOS capacitor to store the photo-generated charge carriers (e.g., electrons). A sixth transistor Mtf 411, the transfer transistor, may be used to transfer the stored charge under Mpg to the charge-sensing node CS. One advantage of utilizing a six-transistor pixel cell over a lower number transistor configuration (e.g., the four-transistor pixel cell) is that the six-transistor pixel cell architecture permits a correlated double sampling to be performed, typically resulting in a reduction of pixel readout noise.

A common technique used in CMOS sensor readout circuitry to reduce pixel-to-pixel fixed-pattern noise is called double sampling. In this technique, a reset reference voltage for each pixel may be read out and subtracted from the photo signal voltage to cancel the common offset voltages due to device mismatches, which could vary from pixel to pixel. However, each reset operation often introduces a temporal noise, commonly referred to as the KTC noise. In the four-transistor pixel cell, for example, the charge storage node (the node that stores the photo-generated charge carriers) and the charge-sensing node (the node that converts the charge to voltage output) are typically the same node. As such, the reset reference voltage at the charge-sensing node of each pixel cell can only be read out after the photo signal voltage is read out (otherwise the stored photo charge will be wiped out); therefore, the reset reference voltage is not correlated with the photo signal voltage. Hence, the KTC noise associated with the signal voltage cannot be cancelled in the four-transistor design. The double sampling performed this way is commonly referred to as an uncorrelated double sampling. Although uncorrelated double sampling may reduce the pixel-to-pixel fixed-pattern noise, it typically can not reduce KTC noise, and in many situations, it increases the KTC noise. On the other hand, in the case of a six-transistor pixel cell, the transfer transistor Mtf effectively separates the charge storage node (the MOS capacitor under the gate of Mpg) from the charge-sensing node CS. During the process of charge integration, the photogate transistor Mpg may be biased in the deep depletion mode (Vpg=Vdd, in the case of NMOS) and the transfer transistor is turned off. At the end of the charge integration, a reset pulse from transistor 250 may reset the charge-sensing node CS. The reset reference voltage at the charge-sensing node may then be read out first using transistor 248 and 260. Next, the transfer transistor 411 may be turned on and the gate voltage of Mpg 410 pulsed into an accumulation mode (Vpg=0, in the case of NMOS) to dump the stored photo charges onto the charge-sensing node so that the photo signal voltage can be read out accordingly. Because the reset reference voltage contains the same KTC noise as in the photo signal voltage, an external subtraction of the reset reference voltage from the photo signal voltage will typically eliminate the KTC noise completely. This operation is referred to as the correlated double sampling. The six-transistor pixel cell configuration typically requires a larger pixel cell area as compared to the four-transistor pixel cell because of the two additional transistors. However, the six-transistor pixel cell configuration is particularly useful in applications where the reduction of pixel-to-pixel fixed-pattern noise while being substantially free of KTC noise is desired, even though a larger pixel cell may be required.

Figure 12:
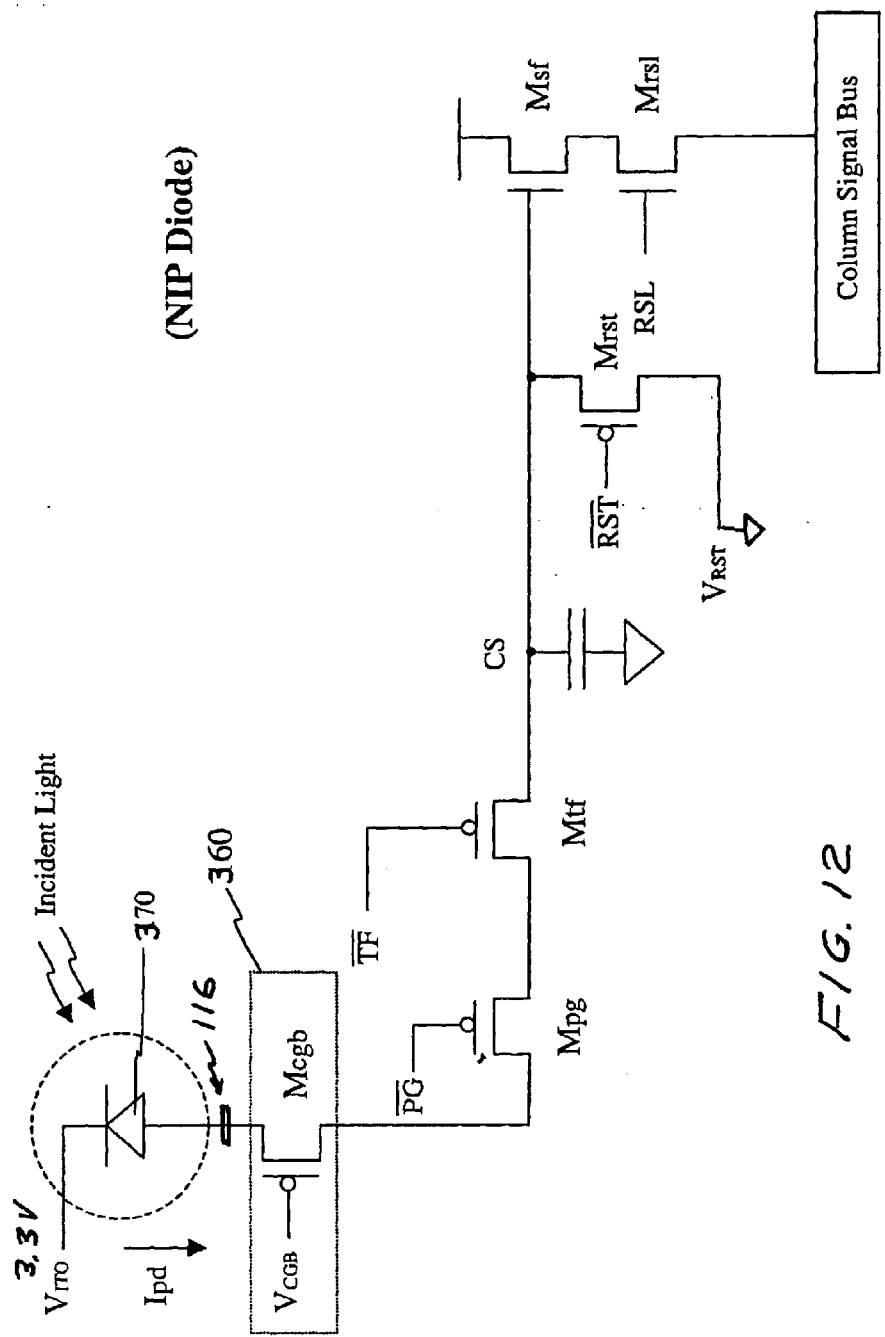
FIG. 12 is a schematic diagram of exemplary circuitry utilizing a six-transistor architecture that may be used for an individual pixel cell having a NIP diode structure.

FIG. 12 is a schematic diagram of exemplary circuitry for a six-transistor pixel cell that may be used for individual pixel cells having a NIP diode structure. The various electrical components shown in this circuit are essentially similar to that shown in the PIN diode structure of FIG. 11, with modifications made to accommodate a NIP diode structure. For example, FIG. 11 shows a six-transistor pixel cell that can be used with a PIN POAP sensor structure where capacitor 246 is discharged through photodiode 370 during integration and the decrease in charge is measured as readout voltages. In contrast, FIG. 12 shows a six-transistor pixel cell that can be used with a NIP POAP sensor structure capacitor 246 is charged through photodiode 370 during integration and the increase in charge is measured as readout voltages. Furthermore, the six-transistor pixel cell shown in FIG. 12 comprises inverted PG, TF, and RST signals, in contrast to non-inverted PG, TF, and RST signals utilized in the PIN diode architecture shown in FIG. 11.

Four Transistor NIP Architecture

Figure 13:
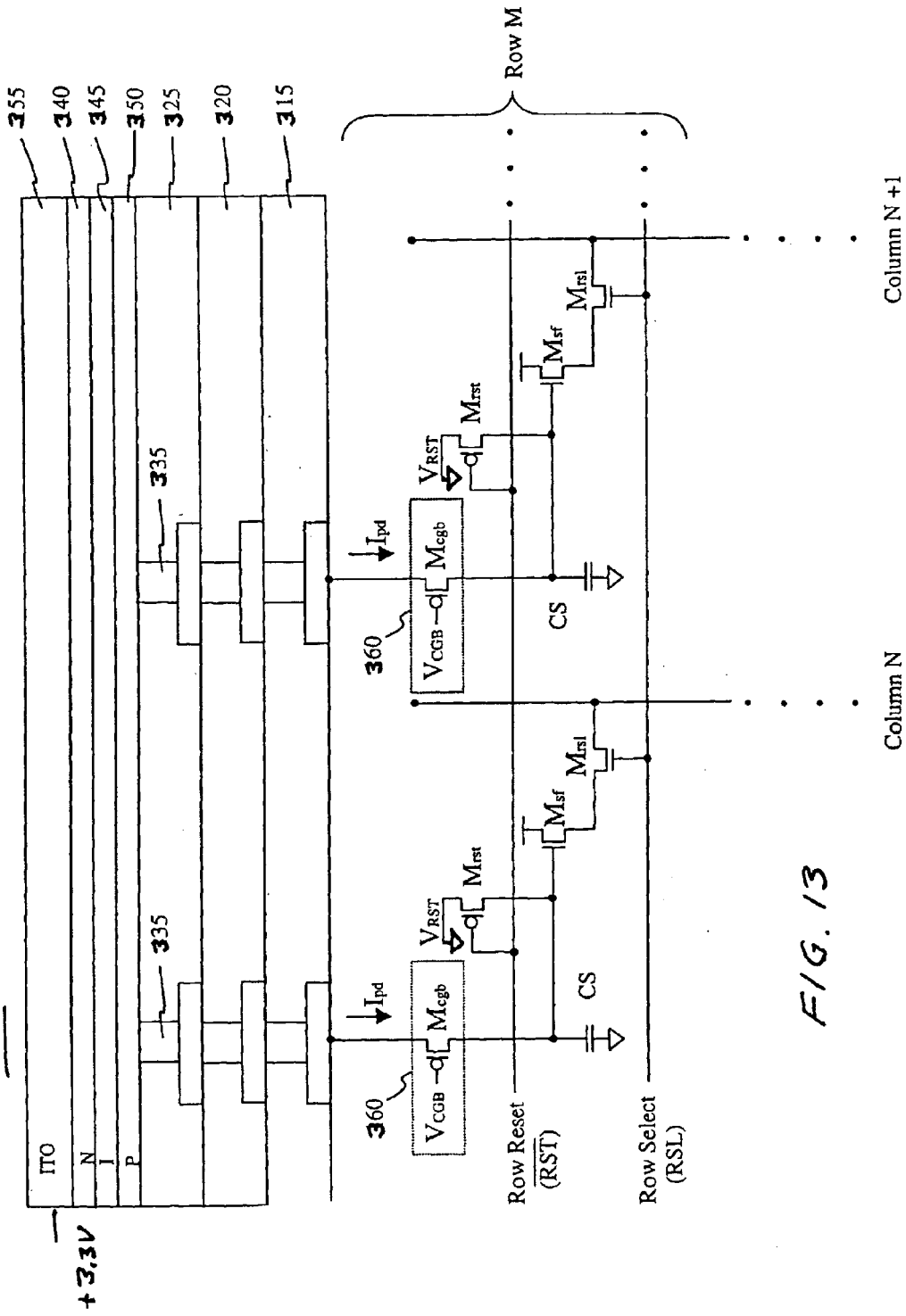
FIG. 13 is a cross-sectional diagram illustrating an alternative embodiment of the POAP sensor of the present invention, as well as some of the related pixel cell circuitry that may be used to support an NIP diode architecture.

FIG. 13 is a cross-sectional view of an alternative embodiment of the present invention and is generally designated 700. Sensor 700 includes architecture that is similar in many respects to that which may be utilized in, for example, sensor 300 (FIG. 5). In particular, sensor 700 may include a multi-tiered interconnection structure having layers 315, 320, and 325 that are formed over a substrate 310. However, sensor 700 comprises an NIP diode architecture, in contrast to the PIN diode configuration is shown in the sensor 300 shown in FIG. 5. Sensor 700 as well as any of the other sensor embodiments, may be configured with additional transistors to accommodate a particular design requirement as described above.

BARRIER LAYER AND INTERLAYER DIELECTRIC LAYER

Figure 14:
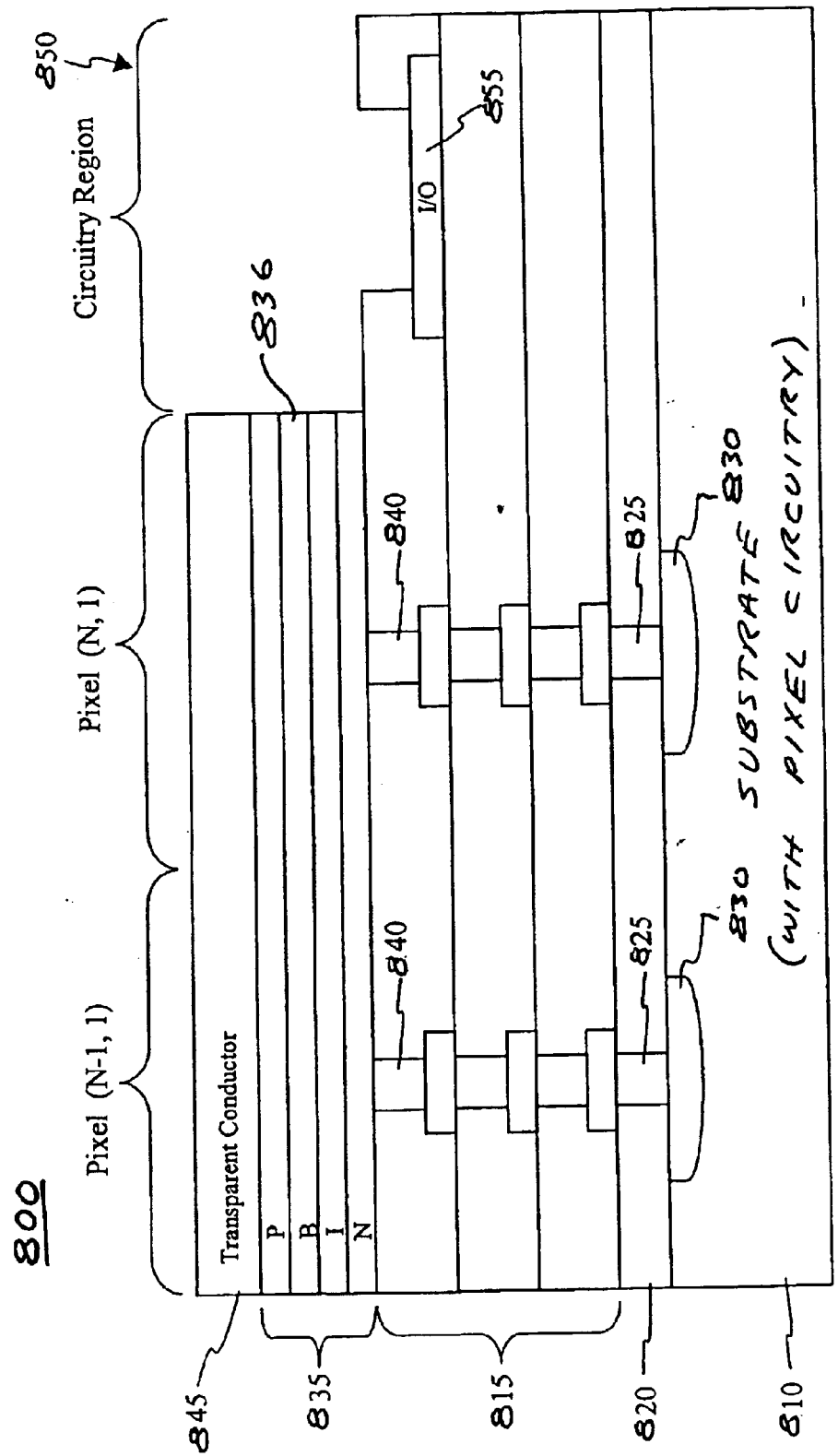
FIG. 14 is a cross-sectional diagram illustrating a first embodiment of a sensor having a barrier layer.

FIG. 14 is a cross-sectional view of a sensor 800 that includes a barrier layer 836 within the PIN photodiode layer structure described above to produce a PBIN photodiode structure. This sensor also includes a special interlayer dielectric layer 820 below the interconnect structure. As shown, sensor 800 includes a substrate 810 (which includes pixel circuits as described above) with an interlayer dielectric layer 820 formed over the substrate 810 and located under interconnect structure 815. This embodiment also includes a diffusion region 830 fabricated in substrate 810 which provides a place of electrical contact for vias 825. The diffusion regions are preferably made by diffusing P or N doping material into regions of the silicon substrate to make those regions conductive. The extra barrier layer 836 in between the p-layer and the i-layer improves the conduction of current through the photoconductive circuit. It is preferably less than 50 angstroms thick and may be comprised of material similar to the i-layer with a small percentage of carbon. Applicant's experiments indicate that a very small amount of p-doping added to the barrier layer may also improve performance of the photoconductive circuit. The extra interlayer dielectric layer 820 is a very thin insulating layer very similar to layers 815. In preferred embodiments, however, it is applied to the silicon wafer by a thermal process (to produce a very thin high quality $SiO_2$ layer) prior to the fabricating the transistors. The 815 $SiO_2$ material for the 815 layers is preferably laid down with CVD processes. The readers should be reminded that the production of 820, 815, 825 and 830 follows the standard integrated circuit fabrication process known in the industry.

Figure 15:
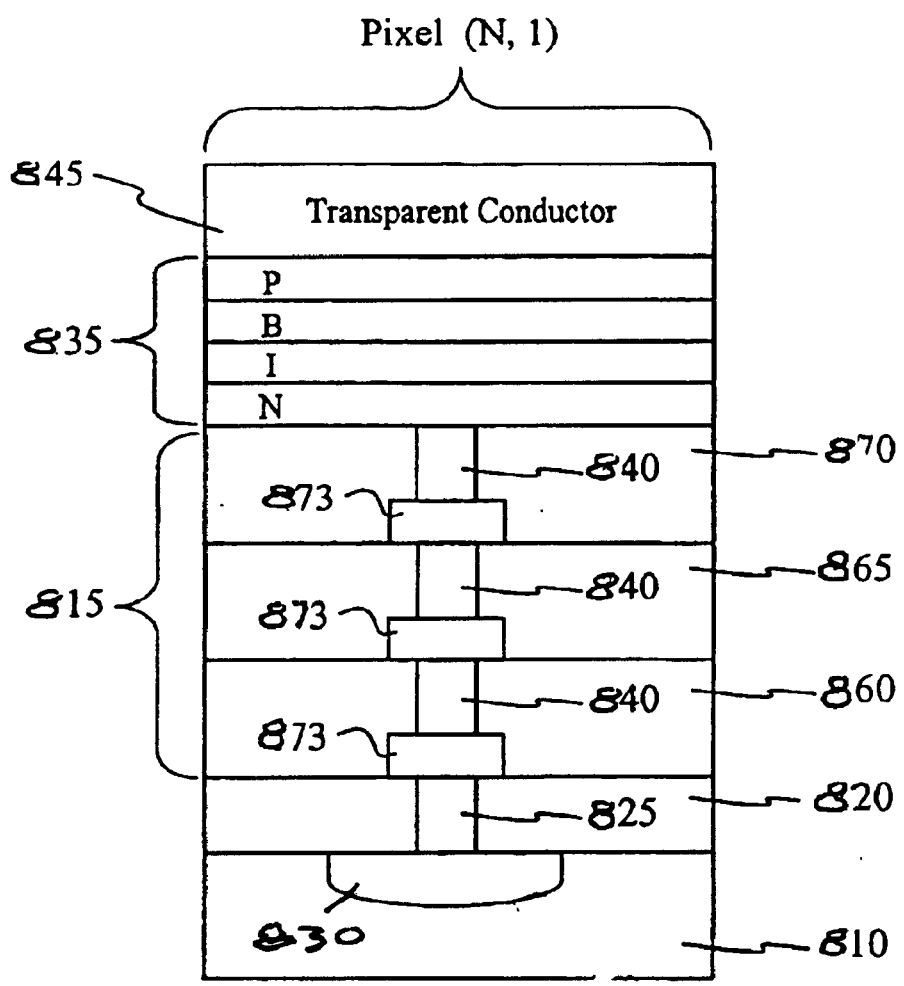
FIG. 15 is a partial cross-sectional diagram illustrating exemplary pixel cell architecture that may be used in any of the POAP sensor embodiments of the present invention.

FIG. 15 shows a more detailed view of pixel cell architecture that may be used by any of the sensor embodiments of the present invention. In particular, FIG. 15 shows the upper portion of an individual pixel cell having a transparent conductor layer 845 formed adjacent to the PBIN radiation absorbing structure 835, which in turn is formed adjacent to an upper surface of the multi-tiered interconnect structure 815. The multi-tiered interconnect structure 815 is shown having three distinct layers, 860, 865, and 870. Each of the three layers of the interconnect structure 815 may include dielectric material (e.g., silicon oxide, silicon nitride, or other similar materials) as insulator material to insulate various metal conductors contained in the layers, metalized regions 873, vias 840 and 825 and other metal transistor connections (not shown). The vias and metalized regions provide electrical connection to diffusion region 830 and, where they contact with the photoconductive layers, they function as the pixel electrode.

Metal Pad

FIG. 16A is a cross-sectional diagram of a sensor utilizing alternative pixel cell architecture, and is generally designated 900. In contrast to the FIG. 15 sensor, the sensor 900 comprises metal pads 876 that are in electrical communication with vias 840. The metal pads 876 may be used in conjunction with the vias 840 to provide a better electrical connection between the radiation absorbing structure 835 (e.g., the bottom n-layer in a PBIN configuration, or a bottom P-layer in a NIBP layered design) and the diffusion region 830. The metal pads 876 may be formed from an appropriate conductive material such as titanium nitride or tungsten.

Alternate Metal Pad Design

Figure 16B:
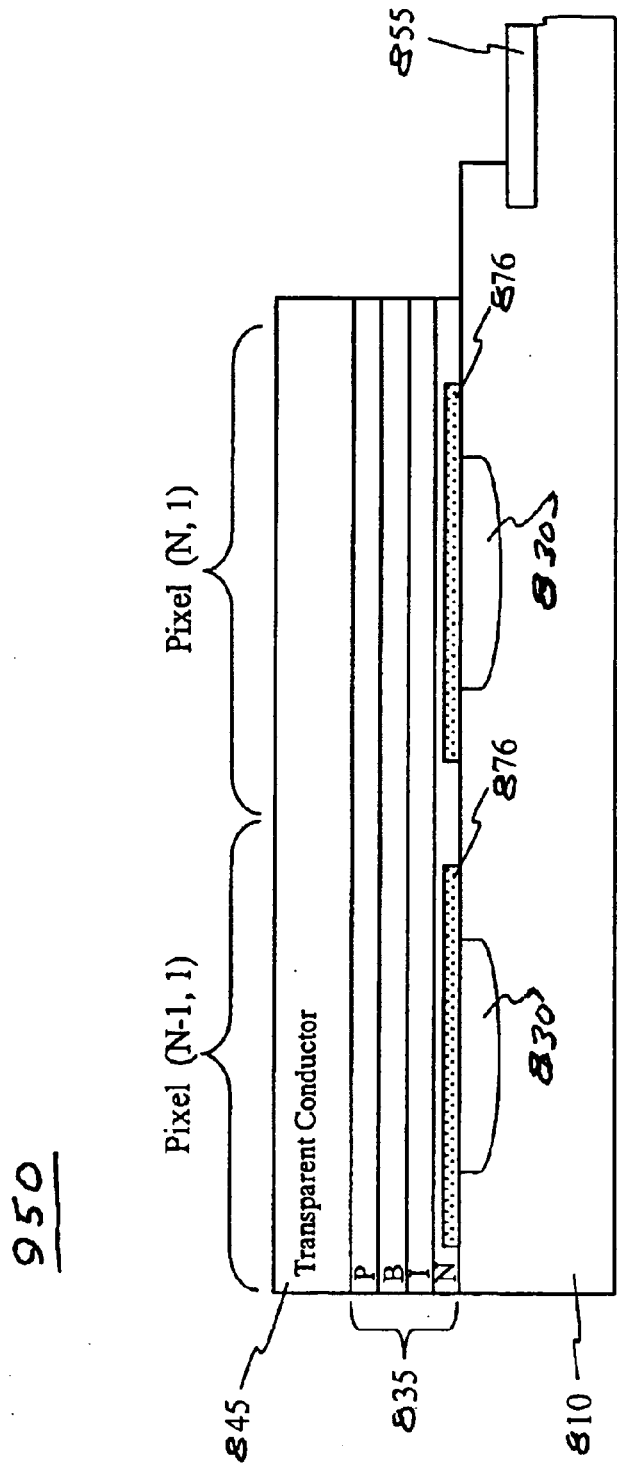
FIG. 16B is a cross-sectional diagram illustrating an alternative embodiment of a PBIN sensor.

FIG. 16B is a cross-sectional diagram of a sensor utilizing alternative pixel cell architecture, and is generally designated 950. This sensor 250 does not utilize an interconnection structure 815 or an interlayer dielectric (ILD) layer 820, which are incorporated in many of the other sensor designs of the present invention. In the illustrated PBIN configuration, an array of charge collecting pixel electrodes may be defined by an array of diffusion regions 830 and an array of metal pads 876.

Additional Circuitry

Figure 17A:
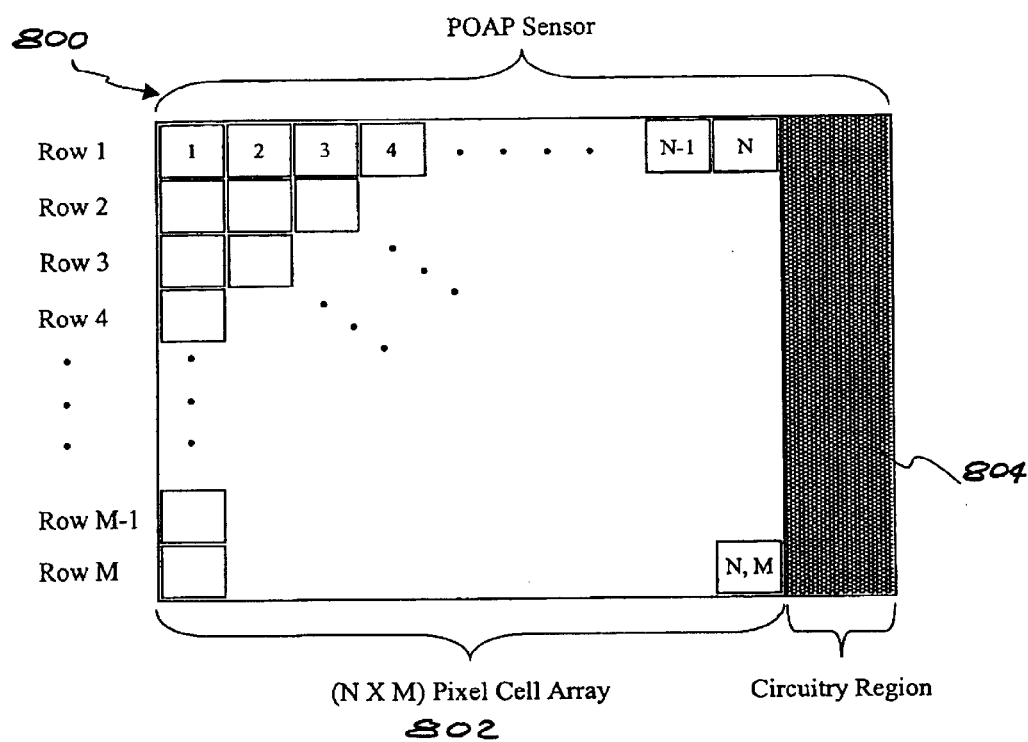
FIG. 17A is a top-view of the POAP sensor of the present invention showing the relative relationship between the pixel cell array and an isolated sensor circuitry region according to one embodiment.

FIG. 17A shows the relative relationship, according to some preferred embodiments of the present invention, of the pixel cell array 802 and the circuitry region 804. In this Figure, the sensor 800 is shown having an (N×M) pixel cell array of individual pixels. Notably, the circuitry region 804 is isolated to the extent that the region occupies a single side of the sensor 800. The circuitry region 804 may include readout and control circuitry that may be necessary to support the associated pixel cell array of the sensor 800. Circuitry region 850 may also be fabricated to include, for example, analog-to-digital converters (ADC), digital signal processors (DSP), timing and control circuitry, as well as circuits providing image-processing support. Circuitry region 804 may further include RF circuitry to accommodate the image data transmission and receiving requirements for use in a wireless imager, for example. POAP sensors of the present invention may include a pixel cell array having a wide range of individual pixel cells. For example, the rows and columns of the (N×M) pixel cell array may each be expanded or reduced to achieve a desired array size and configuration (e.g., 120×160, 256×256, 512×512, 1024×1024, 2048×2048, 4096×4096, etc.) However, it is to be understood that the present invention is not limited to a particular array size or geometry, and most any array configuration, up to and including the available maximum pixel density capabilities of the CMOS fabrication process may be used. The present invention further contemplates the modification of the size of individual pixel cells, as well as the modification of the size and geometries of the pixel cells arrays, to accommodate any lens cost limitations that may exist.

Figure 17B:
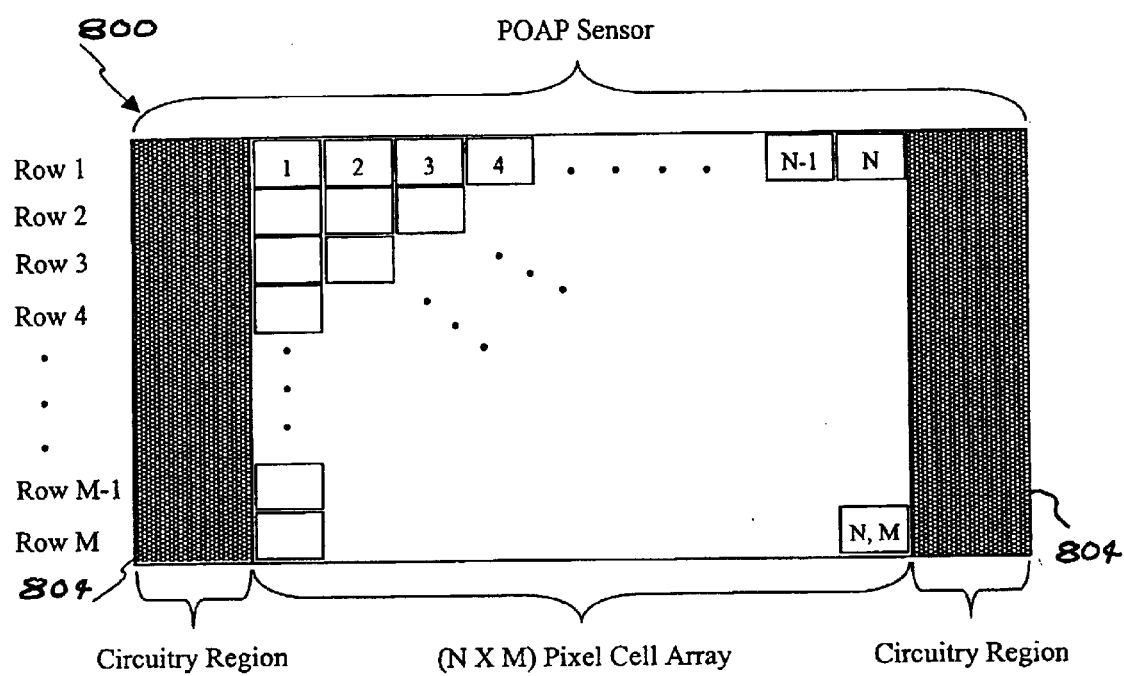
FIG. 17B is a top-view of the POAP sensor of the present invention showing the relative relationship between the pixel cell array and multiple sensor circuitry regions according to another embodiment.
Figure 17C:
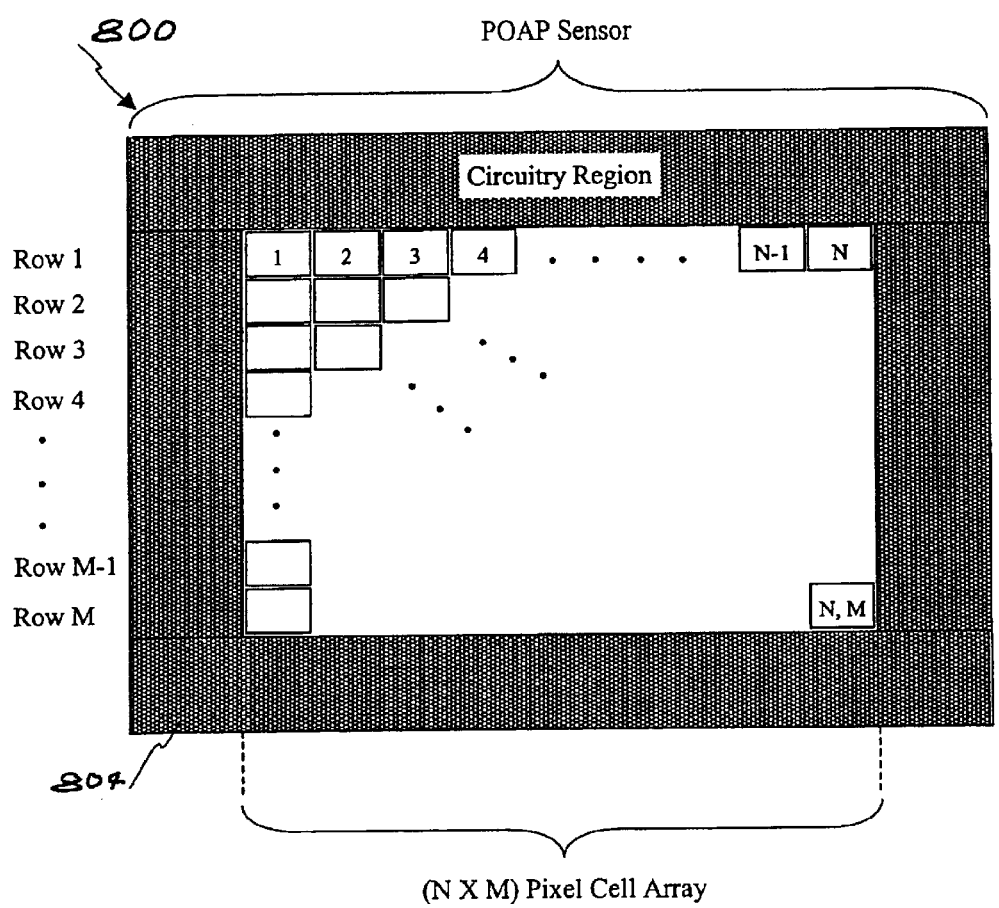
FIG. 17C is a top-view of the POAP sensor of the present invention showing the relative relationship between the pixel cell array and a four-sided sensor circuitry region according to another embodiment.
Figure 19:
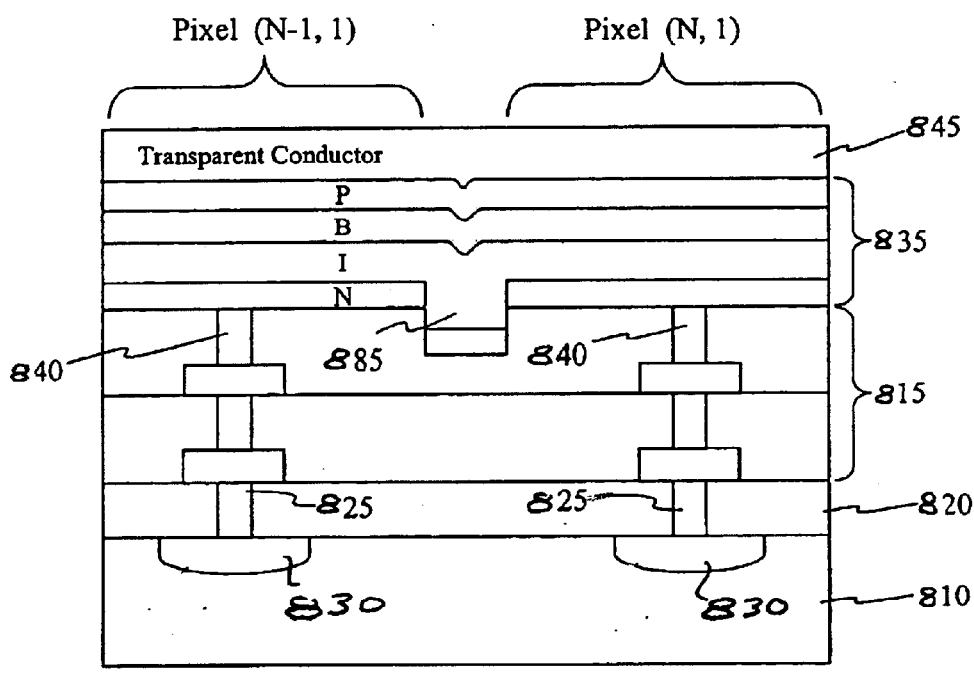
FIG. 19 is a cross-sectional diagram illustrating an alternative embodiment of the POAP sensor of the present invention utilizing a discontinuous photoconductor layer design.
Figure 20:
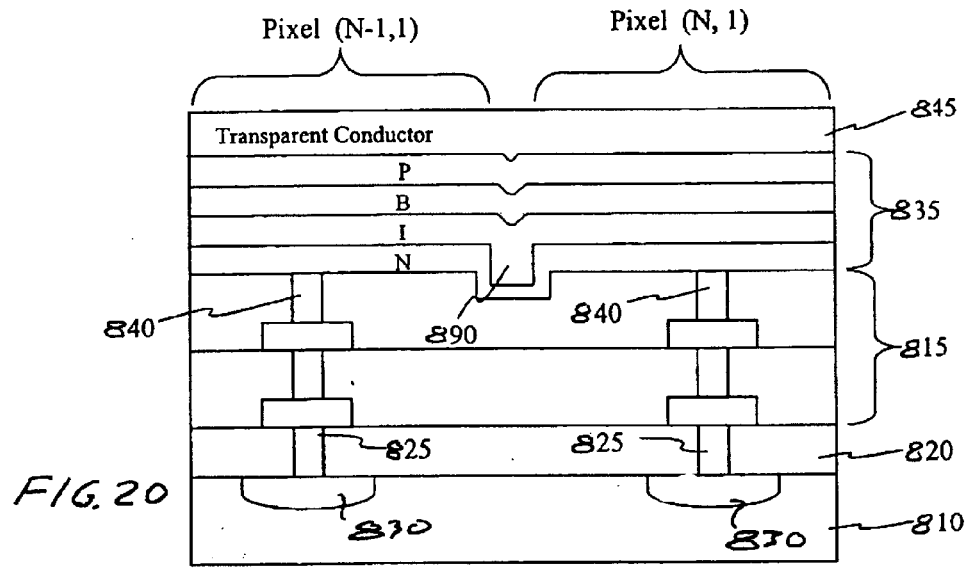
FIG. 20 is a cross-sectional diagram illustrating another alternative embodiment of the POAP sensor of the present invention utilizing a trenched photoconductor layer design.
Figure 21:
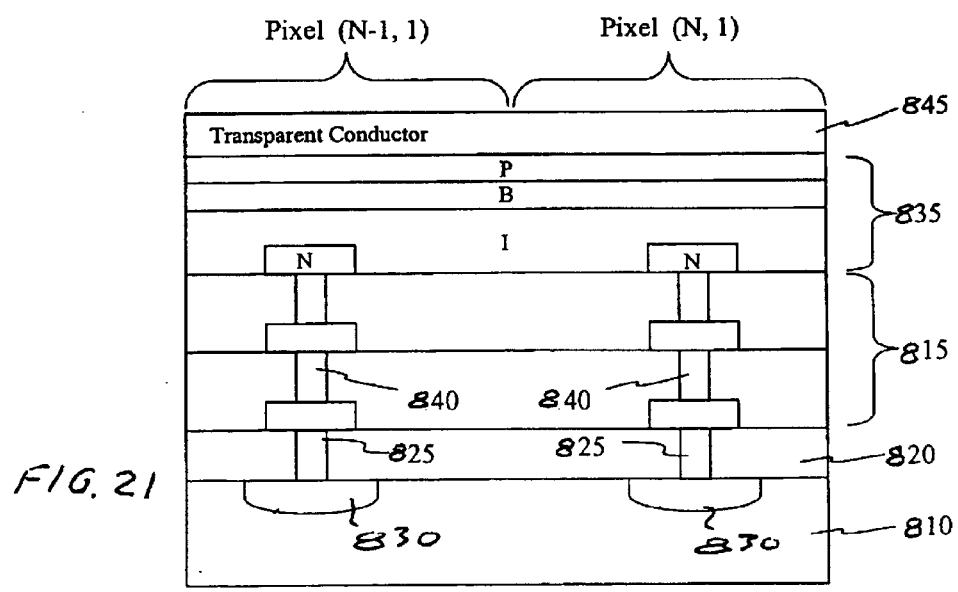
FIG. 21 is a cross-sectional diagram illustrating another alternative embodiment of the POAP sensor of the present invention utilizing a patterned photoconductor layer design.
Figure 22:
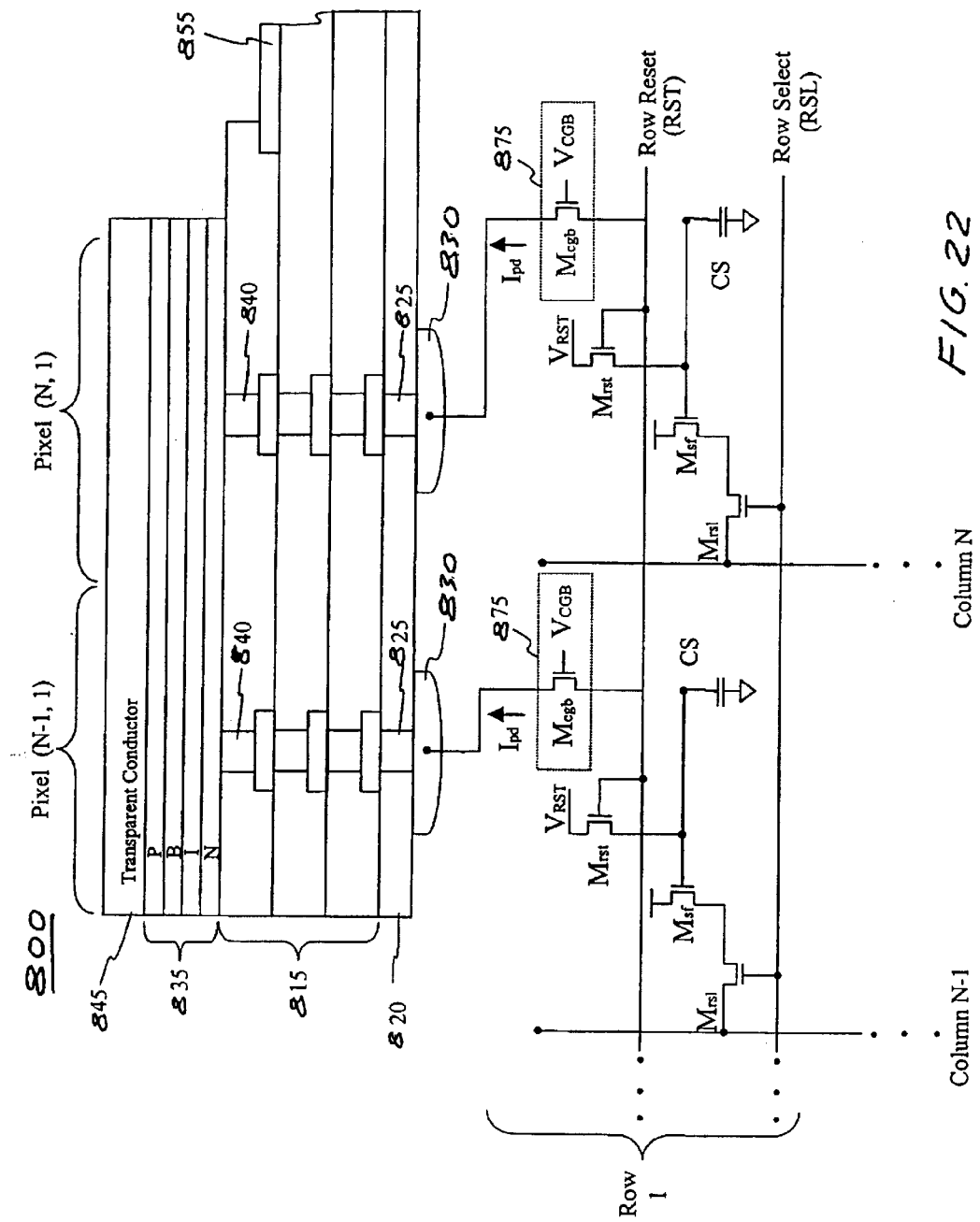
FIG. 22 is a cross-sectional diagram illustrating one embodiment of a PBIN sensor of the present invention, as well as some of the related pixel cell circuitry that may be used to support the PBIN diode architecture.
Figure 23:
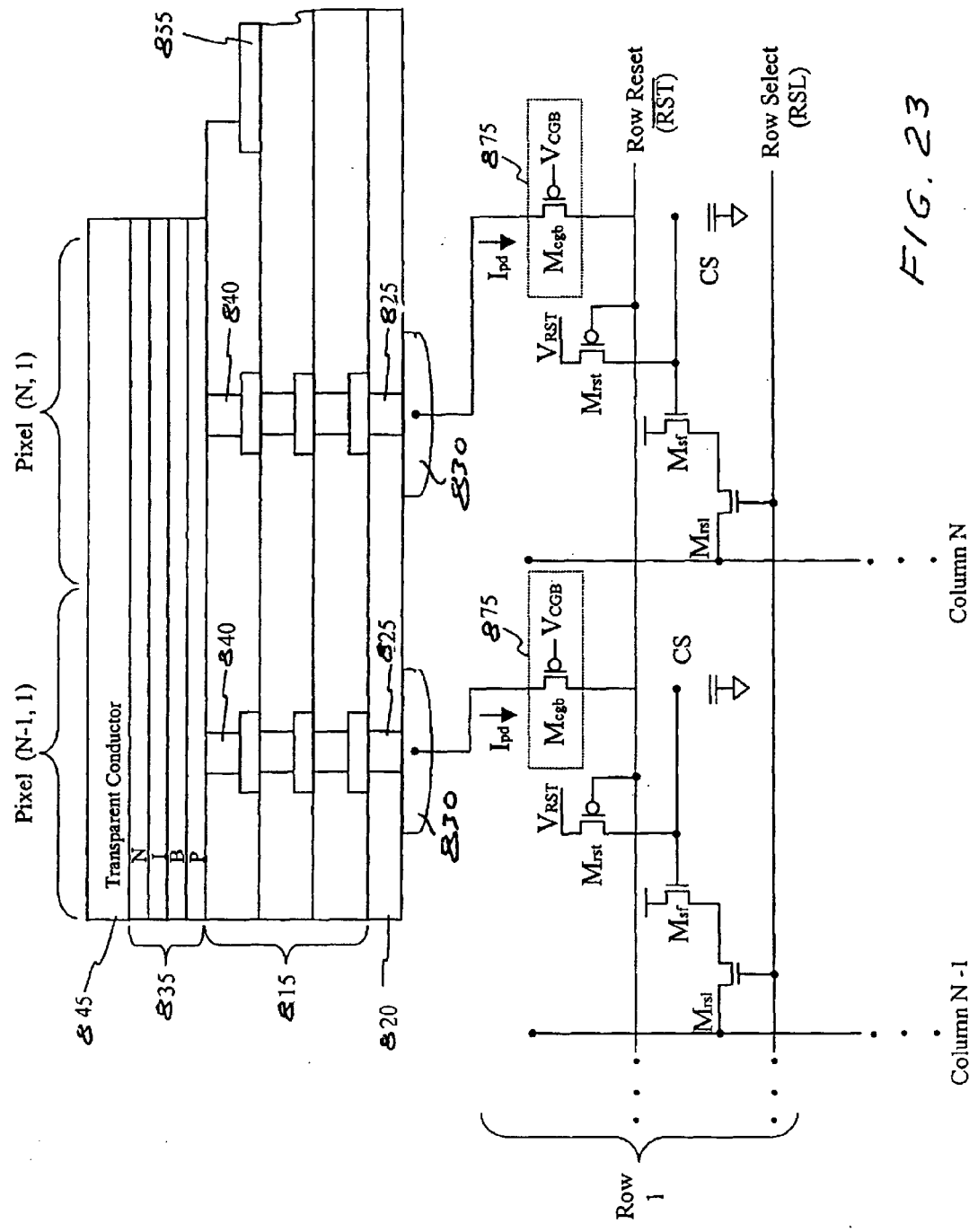
FIG. 23 is a cross-sectional diagram illustrating a NIBP sensor of the present invention, as well as some of the related pixel cell circuitry that may be used to support a NIBP diode architecture.
Figure 24:
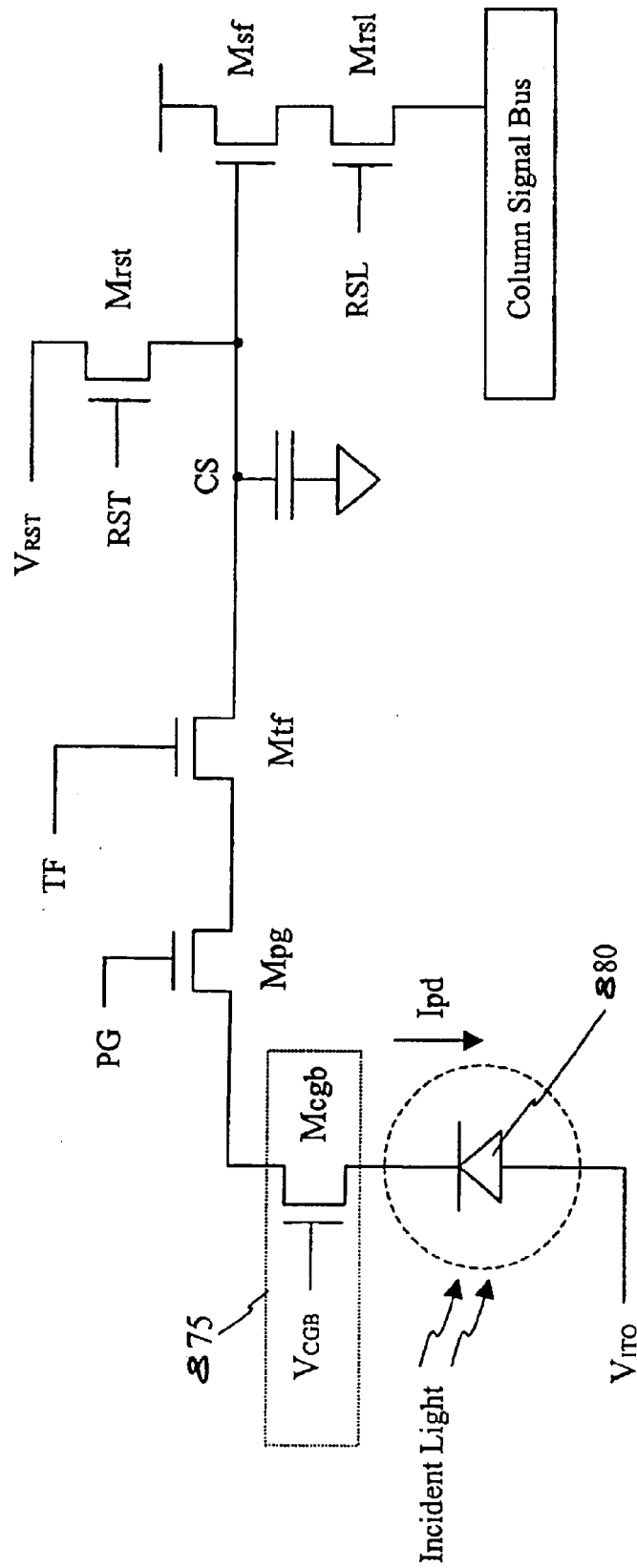
FIG. 24 is a schematic diagram of exemplary circuitry utilizing a six-transistor architecture that may be used for an individual pixel cell having a PBIN diode structure.
Figure 25:
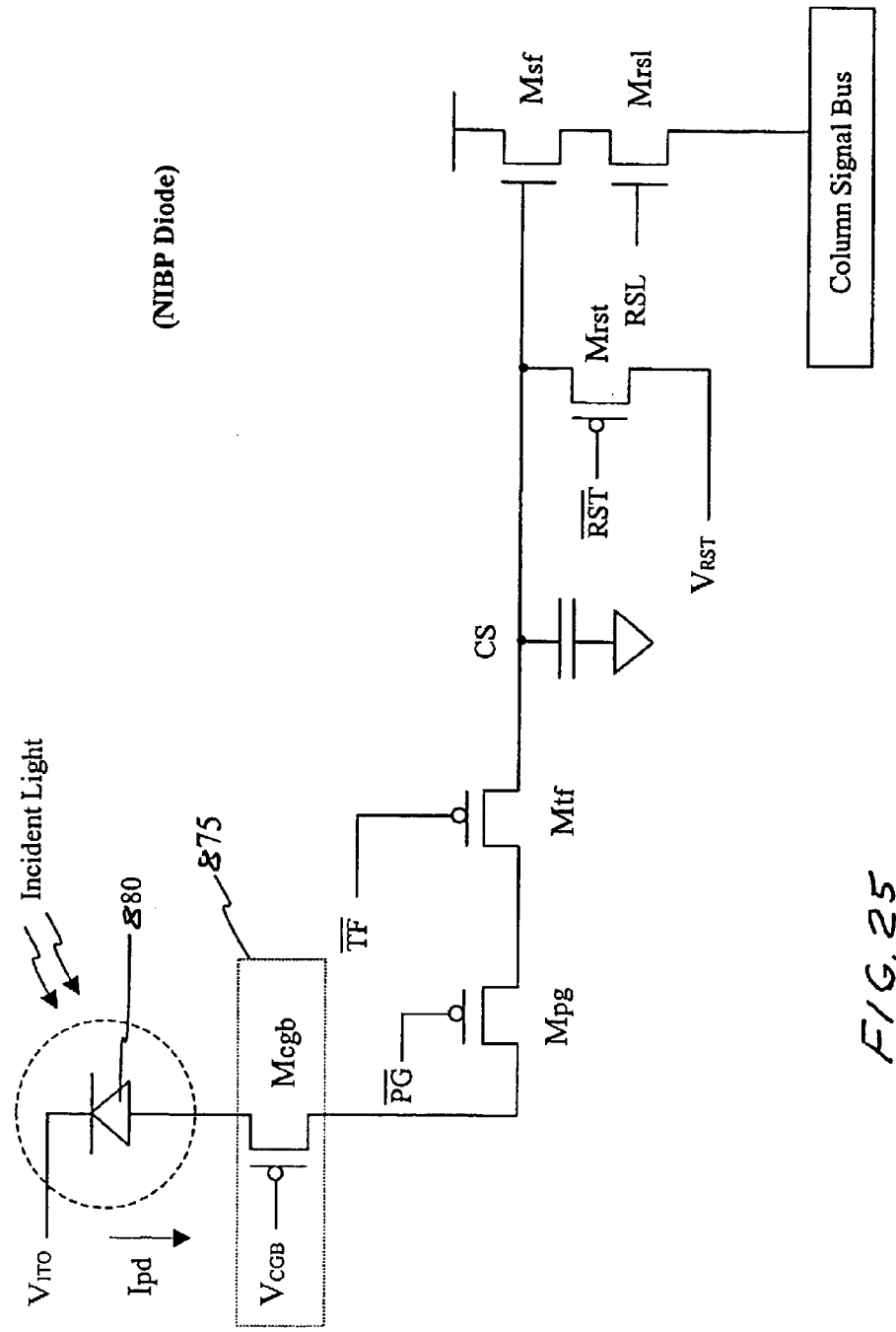
FIG. 25 is a schematic diagram of exemplary circuitry utilizing a six-transistor architecture that may be used for an individual pixel cell having a NIBP diode structure.
Figure 28:
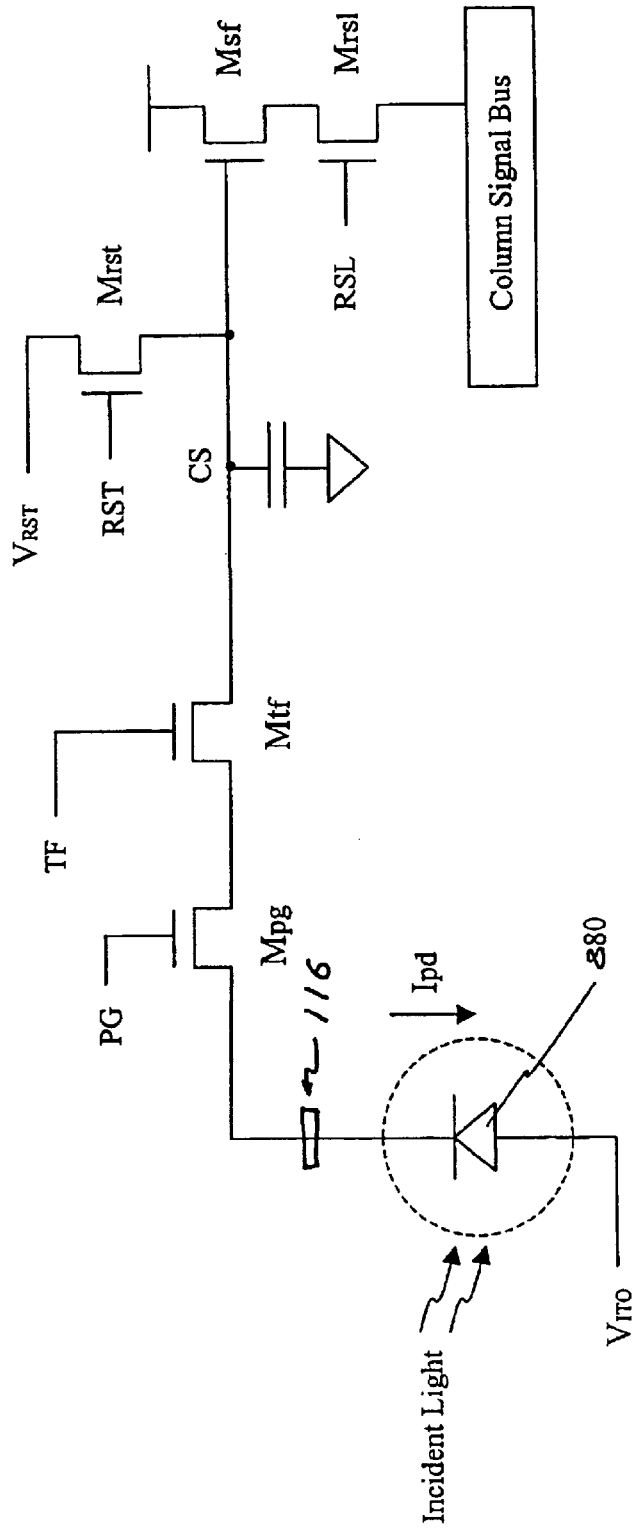
FIG. 28 is a schematic diagram of exemplary circuitry utilizing a five-transistor architecture that may be used for an individual pixel cell having a PBIN diode structure.
Figure 29:
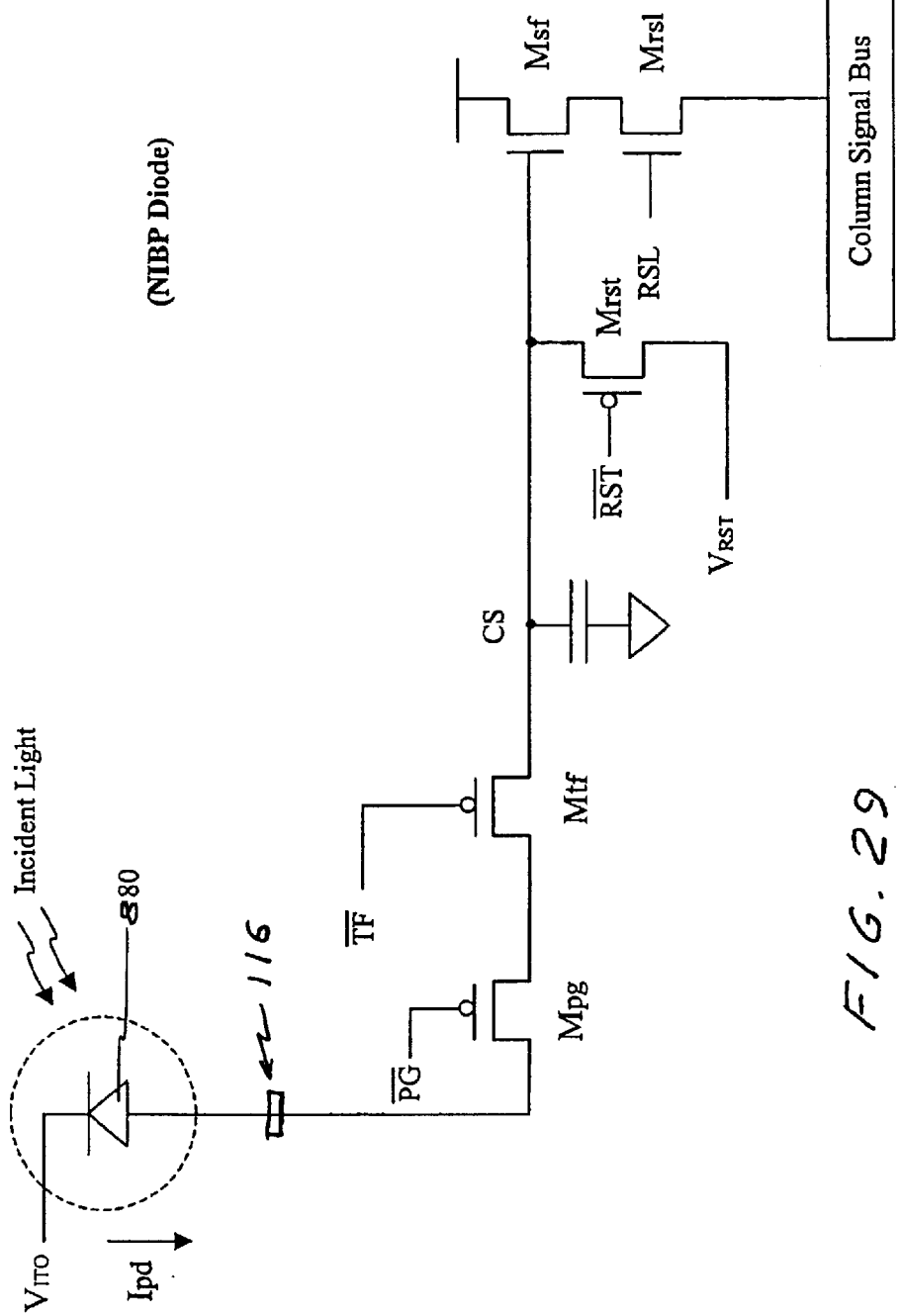
FIG. 29 is a schematic diagram of exemplary circuitry utilizing a five-transistor architecture that may be used for an individual pixel cell having a NIBP diode structure.

FIGS. 17B–C show additional configurations that may be utilized in the POAP sensor of the present invention. FIG. 17B shows sensor 800 having an (N×M) pixel cell array disposed between two circuitry regions 850, while FIG. 17C shows sensor 800 having an (N×M) pixel cell array that is fabricated in such a manner that a circuitry region 804 surrounds the entire pixel cell array. The arrangement of the pixel cell array and circuitry regions shown in FIGS. 17A–C provide sensors that may be used in a variety of different applications. For example, sensor modules may be fabricated by scaling a plurality of individual sensors that utilize one or more of the sensor configurations shown in these Figures. It is to be understood that the circuitry region configurations shown in FIGS. 17A–C may be utilized by any of the sensor designs described herein.

NIBP POAP Sensors

FIG. 18A is a cross-sectional view of a sensor according to an alternative embodiment of the present invention, and is generally designated 1000. Sensor 1000 includes architecture that is similar in many respects to that which may be utilized in, for example, sensor 100 (FIG. 14) except in this case radiation absorbing layer 835 is a NIBP structure instead of a PBIN structure. FIGS. 18B and 18C are cross-sectional diagrams of sensors utilizing alternative pixel cell architecture with metal pads. These sensors are similar in many respects to the sensor and pixel cell architecture shown in FIGS. 16A and 16B except in these cases radiation-absorbing layer is PBIN.

POAP Sensor Fabrication

Figure 30:
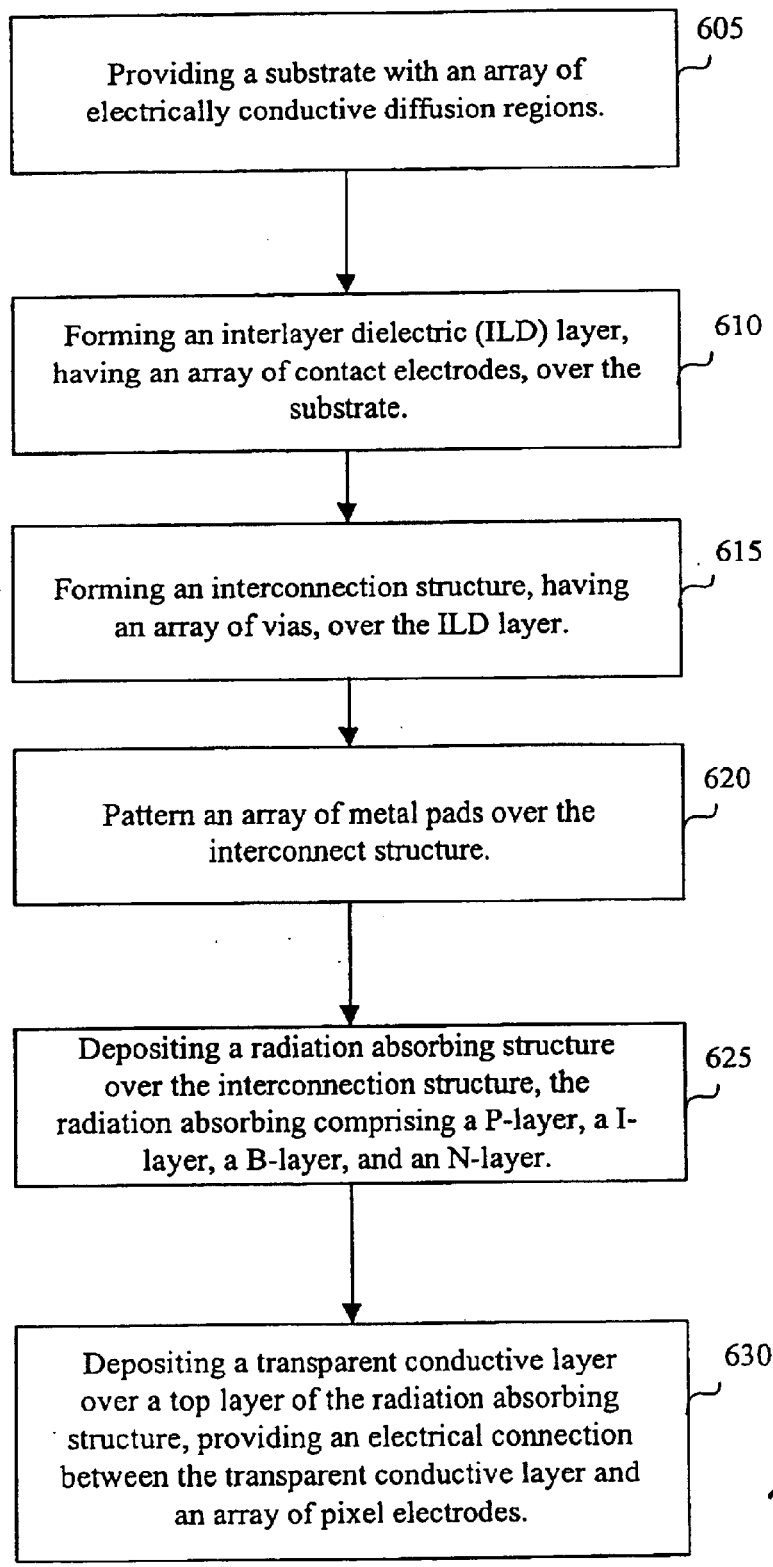
FIG. 30 is a flowchart showing exemplary operations that may be used to fabric a POAP sensor according to one embodiment of the present invention.
Figure 31A:
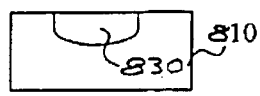
FIGS. 31A–F are partial cross-sectional diagrams showing fabrication steps that may be utilized in fabricating a POAP sensor according to one embodiment of the present invention.
Figure 31B:
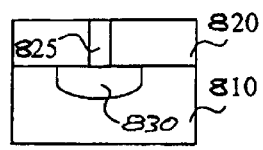
Figure 31C:
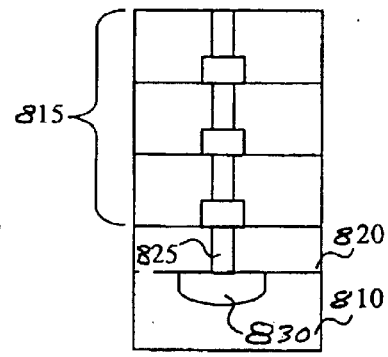
Figure 31D:
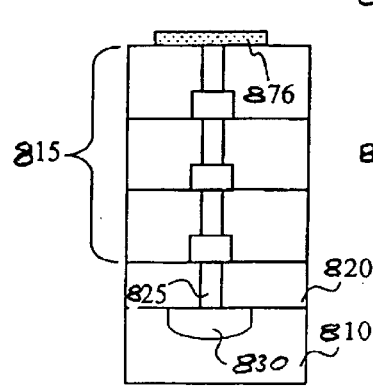
Figure 31E:
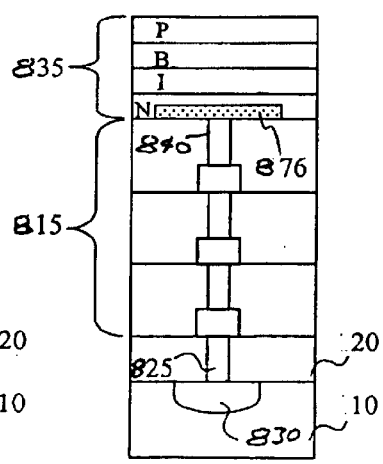
Figure 31F:
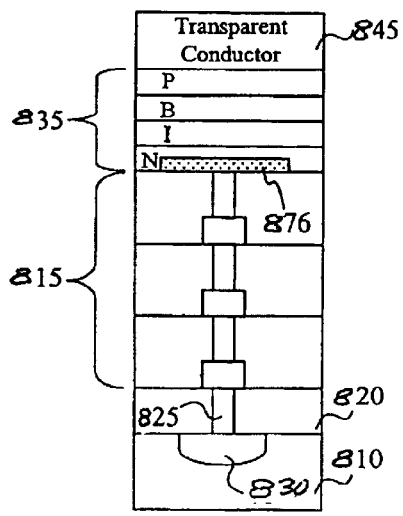

FIG. 30 is a flowchart showing exemplary operations that may be used to fabric a POAP sensor. The formation of a POAP sensor according to one embodiment of the present invention will now be described with reference made to the operations shown in FIG. 30, as well as the sensor fabrication stages shown in FIGS. 31A–F. In FIG. 30, a first operation 605 includes providing a substrate 110 with an array of electrically conductive diffusion regions 830 (FIG. 31A). In these preferred embodiments pixel circuit elements including at least two transistors will be located in the substrate and will be connected to diffusion region 830. Next, in operation 810, an interlayer dielectric (ILD) layer 820 may be formed with an array of contacts 825 that are each associated with one of the array of diffusion regions 830 (FIG. 31B). In operation 815, a multi-tiered interconnection structure 815 may be formed over the ILD layer 820 (FIG. 31C). The conductive vias 840 within the multi-tiered interconnection structure 815 may be formed from an appropriate electrically conductive material, such as tungsten, copper, aluminum, or other similar materials using well known integrated circuit fabrication techniques for producing vias. Typically, the conductive via 840 is formed during a CVD process, but other processes (such as sputtering) may be used. Metal conductors for connecting pixel circuit elements may also be included in these multi-tiered interconnection. In optional operation, a metal pad 876 may be patterned adjacent the interconnection structure 815, enabling an improved electrical connection between via 840 and photoconductive layer 835 (FIG. 31D). In the next operation, separate PBIN layers are each successively deposited over the interconnection structure 815 to form the radiation absorbing structure 835 (FIG. 31E). Alternatively, in situations where an NIBP diode structure is desired (e.g., sensor 1000 shown in FIG. 18A), separate NIBP photodiode layers may each be successively deposited over the interconnection structure 815 to form the radiation absorbing structure. Typically, the deposition of the various layers of the radiation absorbing structure 835 is accomplished during a PECVD process. Again, it is to be understood that according to one embodiment, the radiation absorbing structure 835 may be formed during a continuous deposition processes because it is not necessary to pattern one or more of these layers (e.g., a bottom N-layer in a PBIN diode structure). A transparent conductor layer 845 may be deposited over the top layer of the radiation absorbing structure 835 (FIG. 31F). The transparent conductor layer 845 provides an electrical connection between the top layer of the radiation absorbing structure 835 (e.g., a p-layer in a PBIN diode structure, or an n-layer in a NIBP diode structure) to ground or to a supply voltage source. The transparent conductor layer 845 may be deposited through reactive sputtering. Alternatively, the transparent conductor layer 845 may be grown by evaporation. However, if the transparent conductor layer 845 is formed from titanium nitride, then a CVD process or sputtering process is typically utilized.

Applications, Other Features and Variations

While there have been shown what are presently considered to be preferred embodiments of the present invention, it will be apparent to those skilled in the art that various changes and modifications can be made herein without departing from the scope and spirit of the invention.

Applications

An appropriately configured sensor unit utilizing the POAP sensor architecture may be utilized in a variety of applications, including cameras, machine vision systems, vehicle navigation systems, video telephones, computer input devices, surveillance systems, auto focus systems, star trackers, motion detection systems, image stabilization systems, scanners, and other similar devices. Those who may also benefit from the use of such devices include law enforcement, medical, fire departments, emergency service and search and rescue operations, as well as the military and intelligence communities. Additional uses may include non-destructive testing, preventative maintenance operations, commercial security applications, as well as the automotive industry for providing, for example, a driver with low light level viewing enhancement devices.

Doping

The doping of various layers of the sensor of the present invention may be achieved by known semiconductor manufacturing processes. These processes may be used to create a layer having a doping gradient, e.g., a doping concentration that varies as a function of depth of the layer, or an abrupt change in the doping concentration. The doping gradient, or profile, may be optimized for a particular sensor design. Although several specific examples of appropriate materials that may used to fabricate the radiation absorbing structure 835 have been described, the present invention is not so limited.

In preferred embodiments, Applicants use Plasma Enhanced Chemical Vapour Deposition technique to grow NIP photodiode layers. This technique is known in the industry. We grow p-layer first, which is the layer making contact to the pixel pads. The p-type impurity used in our film is boron. In order to increase the resistivity, we also doped the p-layer with carbon atoms/molecules. The boron impurity is in the order of magnitude of $10^{20}$–$10^{21}$ atoms/cc. And the carbon atoms/molecules are in the order of magnitude of $10^{21}$–$10^{22}$ atoms/cc. The intrinsic layer is targeted to have only Si atoms and hydrogen atoms, where hydrogen atoms preferably are in the order of magnitude of $10^{21}$–$10^{22}$ atoms/cc. Of course, there could be some unintended impurities found in the films. The n-layer, making contact with ITO, should only have n-type impurity and hydrogen atoms. The n-type impurity used in our case is phosphorous (P) whose concentration is targeted to be in the order of magnitude of $10^{20}$–$10^{21}$ atoms/cc. In both p-layer and n-layer, the hydrogen content is targeted to be in the order of magnitude of $10^{21}$–$10^{22}$.

Protective Layer

The transparent conductor layer 845 (shown in FIG. 31F) may be formed from an indium tin oxide (ITO), tin oxide, titanium nitride, thin silicide, or other similar materials. A protective layer (not shown) may also be formed over the transparent conductor 145. The protective layer may provide mechanical protection, electrical insulation, as well as providing anti-reflective characteristics.

Defect Correction Circuitry

Defect correction circuitry can be utilized. The purpose of this circuitry is to remove "single pixel defect" or "small cluster defects" in the video stream without predetermined defect locations. The way the circuitry works is that the sensor is programmed to look at a pixel and its nearest neighbors and compare the pixel value against the norm of the area. If this pixel has a value greater or smaller than the norm by an empirically determined threshold, this pixel will then be considered "defective". This pixel will then be replaced by the norm. This technique can remove defects but it can also remove real information if the information is one pixel wide, which is very unlikely in the normal camera applications. This circuitry can potentially improve sensor yield substantially since yield loss of today's and foreseeable future manufacturing process is due to "single pixel defects".

Micro Crystalline Silicon

In preferred embodiments the base material for fabrication of the radiation absorbing layers (i.e. the PIN, NIP, PBIN or NIBP layer) is micro crystalline silicon ($\mu$c-Si) and $\mu$c-Si(Ge) instead of amorphous silicon, this results in a broadening of the spectral response from 350 nm–700 nm for a-Si to 300 nm–1000 nm for $\mu$c-Si and 300 nm–1200 nm for $\mu$c-Si(Ge). Another benefit from moving into $\mu$c-Si or $\mu$c-Si(Ge); is at least a 10 fold improvement in response time. This can lead to sensors running at kHz frame rate.

HDTV Format Sensor

For a 2 million-pixel HDTV format sensor, Applicants incorporate two unique circuits, one is a "column analog-to-digital converter (ADC)" and another one is a "delta-double sampling" DDS scheme. In a preferred sensor, an ADC is provided for each column (a preferred sensor has 1920 (columns)×1280 (rows)). The purpose of column ADC is to relax the sampling rate for the ADC. An array of 2.1M pixels runs at 30 Hz and 10-bits. This means a single ADC would need to run 60M 10-bit samples per second. This will put the ADC at the cutting edge design and fabrication process. With the "column ADC", Applicants can reduce the sampling rate by the number of columns, 1920 for our case. Then Applicants can relax the sampling rate requirement for ADC design and use the same CMOS process for other circuits. The DDS scheme converts two signals consecutively, one for the true signal and one for reference out of each pixel. Applicants' circuitry converts the two signals into digital numbers and take the difference of the two to represent the true video signal. This circuit is to minimize any possible offset (due to either circuit or process non-uniformity) from the charge storage capacitor in the pixel to the input of column ADC. This DDS can improve the uniformity and relax the uniformity requirements on the fabrication process.

Uses of Small Camera

Embodiments of the present invention provides a camera potentially very small in size, potentially very low in fabrication cost and potentially very high in quality. Naturally there will be some tradeoffs made among size, quality and cost, but with the high volume production costs in the range of a few dollars, a size measured in millimeters and image quality measured in mega-pixels or fractions of mega-pixels, the possible applications of the present invention are enormous. Some potential applications in addition to cell phone cameras are listed below:

Analog camcorders

Digital camcorders

Security cameras
Digital still cameras
Personal computer cameras
Toys
Endoscopes
Military unmanned aircraft, bombs and missiles
Sports
High definition Television sensor Since the camera can be made smaller than a human eyeball, one embodiment of the present invention is a camera fabricated in the shape of a human eyeball. Since the cost will be low the eyeball camera can be incorporated into many toys and novelty items. A cable may be attached as an optic nerve to take image data to a monitor such as a personal computer monitor. The eyeball camera can be incorporated into dolls or manikins and even equipped with rotational devices and a feedback circuit so that the eyeball could follow a moving feature in its field of view. Instead of the cable the image data could be transmitted wirelessly using cell phone technology. The small size of these cameras permits them along with a cell phone type transmitter to be worn (for example) by professional football players installed in their helmets. This way TV fans could see the action of professional football the way the players see it. In fact, the camera plus a transmitter could even be installed in the points of the football itself which could provide some very interesting action views. These are merely examples of thousands of potential applications for these tiny, inexpensive, high quality cameras. The small camera can be used without the lens to monitor the light intensity profile and output the change of intensity and profile. This is crucial in optical communication application where beam profile needs to be monitored for highest transmission efficiency. This camera can be used to extend light sensing beyond visible spectrum when the amorphous-Silicon is replaced with other light sensing materials. For example, one can use microcrystalline-Silicon(Germanium) to extend the light sensing toward near-infrared range. Such camera is well suitable for night vision. In the preferred embodiment, we use a package where senor is mounted onto a chip carrier on which is clicked onto a lens housing. One can also change the assembly sequence by solder the sensor onto a sensor board first, then put the lens holder with lens to cover the sensor and then mechanically fasten onto the PCB board to make a camera. This is a natural variation from this invention to those skilled in the art.

Other Uses of Invention

An appropriately configured sensor unit utilizing the POAP sensor architecture may be utilized in a variety of applications in addition to the ones specifically described above, such as machine vision systems, vehicle navigation systems, video telephones, computer input devices, surveillance systems, auto focus systems, star trackers, motion detection systems, image stabilization systems, scanners, and other similar devices. Those who may also benefit from the use of such devices include law enforcement, medical, fire departments, emergency service and search and rescue operations, as well as the military and intelligence communities. Additional uses may include non-destructive testing, preventative maintenance operations, commercial security applications, as well as the automotive industry for providing, for example, a driver with low light level viewing enhancement devices.

Other Variations

The transparent layer could be replaced with a grid of extremely thin conductors. The readout circuitry and the camera circuits 140–148 as shown in FIG. 2 could be located partially or entirely underneath the CMOS pixel array to produce an extremely tiny camera. The CMOS circuits could be replaced partially or entirely by MOS circuits. Some of the circuits 140–148 shown on FIG. 2 could be located on one or more chips other than the chip with the sensor array. For example, there may be cost advantages to separate the circuits 144 and 146 onto a separate chip or into a separate processor altogether. The number of pixels could be increased or decreased from 0.3 mega-pixels almost without limit.

Thus, the scope of the invention is to be determined by the appended claims and their legal equivalents.

What is claimed is:

1. An active MOS or CMOS sensor comprising:
   A) a crystalline substrate,
   B) a charge generating photoconducting layer comprised of at lease two layers of charge generating material for converting the light into electrical charges,
   C) a plurality of MOS or CMOS pixel circuits fabricated in said substrate below said charge generating layer, each pixel circuit comprising a charge collecting electrode, a capacitor and at least two transistors, said pixel circuits being arranged to collect and read out charges generated in said charge generating layers,
   D) a surface electrode in the form of a thin transparent layer or grid located above said layer of charge generating material, and
   E) an electrical source for providing a voltage drop across said charge generating photoconducting layer.

2. The sensor as in claim 1 wherein said plurality of MOS or CMOS pixel circuits is a plurality of CMOS pixel circuits.

3. The sensor as in claim 1 wherein a metal pad is used as the charge collecting electrode in each said pixel.

4. The sensor as in claim 1 wherein said plurality of pixels is at least 0.1 million pixels.

5. The sensor as in claim 1 and further comprising additional MOS or CMOS circuits in and/or on the same crystalline substrate with said active sensor array for converting into images charges read out by said pixel circuits.

6. The sensor as in claim 1 wherein said layer of charge generating material comprises a p-doped layer, an intrinsic layer and an n-layer.

7. The sensor as in claim 6 wherein said surface electrode is comprised of ITO.

8. The sensor as in claim 6 wherein said n-layer is located adjacent to said surface electrode and said p-layer is located adjacent to charge collecting electrode.

9. The sensor as in claim 6 and further comprising a barrier layer between said p-layer and said i-layer.

10. The sensor as claim in 8 wherein said p-layer comprises carbon atoms or molecules.

11. The sensor as in claim 1 wherein each pixel circuit of said plurality of pixel circuits further comprises a gate bias transistor separating said charge collecting electrode from said capacitor.

12. The sensor as in claim 6 wherein each pixel circuit of said plurality of pixel circuits further comprises a gate bias transistor separating said charge collecting electrode from said capacitor.

13. The sensor as in claim 12 wherein the gate bias transistor is held at a constant voltage.

14. The sensor as in claim 1 and further comprising an interconnect structure formed above said crystalline substrate and below said charge generating layer.

15. The sensor as in claim 14 wherein said interconnect structure comprises at least two sublayers each comprising conducting vias providing electrical communication between said plurality of pixel circuits and said charge generating layer.

16. The sensor as in claim 1 and also comprising data analyzing circuits fabricated on said crystalline substrate.

17. The sensor as in claim 16 and also comprising image manipulation circuits fabricated on said crystalline substrate.

18. The sensor as in claim 17 and also comprising decision and control circuits fabricated on said crystalline substrate.

19. The sensor as in claim 18 and also comprising communication circuits fabricated on said crystalline substrate.

20. The sensor as in claim 1 wherein said array is an integral part of a camera attached by a cable to a cellular phone.

21. The sensor as in claim 1 wherein said surface electrode is comprised of a layer of indium tin oxide.

22. The sensor as in claim 1 wherein said at least two layers of said charge generating layer are comprised primarily of hydrogenated amorphous silicon.

23. The sensor as in claim 1 wherein said at least two layers of said charge generating layers are comprised of micro crystalline silicon or micro crystalline Si(Ge).

24. The sensor as in claim 1 and further comprising a protective layer.

25. The sensor as in claim 1 and further comprising circuitry for locating defective pixels and substituting normalized data for the defective pixels.

26. The sensor as in claim 1 wherein said array in an integral part of a camera in a cellular phone.

27. The sensor as in claim 1 and further comprising an array of color filters located on top of said surface electrode.

28. The sensor as in claim 27 wherein said color filters are comprised of red, green and blue filters arranged in four color quadrants of two green, one red and one blue.

29. The sensor as in claim 1 wherein said sensor is a part of a camera fabricated in to form of a human eyeball.

30. The sensor as in claim 18 wherein said decision and control circuits comprise a processor programmed with a control algorithm for analyzing pixel data and based on that data controlling signal output from said sensor array.

31. The sensor as in claim 30 wherein said processor controls signal output by adjusting pixel illumination time.

32. The sensor as in claim 30 wherein said processor controls signal output by adjusting signal amplification.

33. The sensor as in claim 1 wherein said sensor is a part of a camera incorporated into a device chosen from the following group:

Analog camcorder

Digital camcorder

Security camera

Digital still camera

Personal computer camera

Toy

Endoscope

Military unmanned aircraft, bomb and missile

Sports equipment

High definition Television sensor.

34. A camera with a MOS or CMOS based active sensor array for producing electronic images from charge producing light, said camera comprising:

A) a crystalline substrate,

B) a charge generating photoconducting layer comprised of at lease two layers of charge generating material for converting the light into electrical charges, C) a plurality of MOS or CMOS pixel circuits fabricated in said substrate below said charge generating layer, each pixel circuit comprising a charge collecting electrode, a capacitor and at least three transistors, said pixel circuits being arranged to collect and read out charges generated in said charge generating layers, D) a surface electrode in the form of a thin transparent layer or grid located above said layer of charge generating material, E) an electrical source for providing a reverse bias across said charge generating photoconducting layer, F) additional MOS or CMOS circuits in and/or on the same crystalline substrate with said active sensor array for converting the charges into images, G) additional MOS or CMOS circuits in and/or on the same crystalline substrate with said active sensor array for timing and signal synchronization, and H) focusing optics for focusing electron-hole producing light onto said active sensor array.

* * * * *